US012719475B2

(12) United States Patent
Huang et al.

(10) Patent No.: US 12,719,475 B2
(45) Date of Patent: Aug. 25, 2026

(54) PULL-UP-PULL-DOWN-INVERTER (PUDI), PUDI-BASED SYSTEM FOR CONTINUOUS-TIME LINEAR-EQUALIZATION, AND METHOD OF OPERATING SAME

(71) Applicant: TAIWAN SEMICONDUCTOR MANUFACTURING COMPANY, LTD., Hsinchu (TW)

(72) Inventors: Chieh Jen Huang, Hsinchu (TW); Mu-Shan Lin, Hsinchu (TW); Wen-Hung Huang, Hsinchu (TW); Shu-Chun Yang, Hsinchu (TW); Wei Chih Chen, Hsinchu (TW); Chien-Chun Tsai, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 144 days.

(21) Appl. No.: 18/752,155

(22) Filed: Jun. 24, 2024

(65) Prior Publication Data

US 2025/0392309 A1 Dec. 25, 2025

(51) Int. Cl.

*H03K 19/003* (2006.01)
*H03K 5/24* (2006.01)
*H03K 19/0185* (2006.01)

(52) U.S. Cl.

CPC ..... *H03K 19/00384* (2013.01); *H03K 5/2472* (2013.01); *H03K 19/018521* (2013.01)

(58) Field of Classification Search

CPC ..... H03K 19/00384; H03K 19/018521; H03K 5/2472; G06F 30/33

See application file for complete search history.

(56) References Cited

U.S. PATENT DOCUMENTS

| | | | | |
|---|---|---|---|---|
| 7,368,902 | B2 * | 5/2008 | Clements | G01R 35/007 363/95 |
| 11,489,705 | B1 * | 11/2022 | Casey | H04L 25/03038 |
| 2004/0263199 | A1 * | 12/2004 | Braceras | G01R 31/3004 324/762.09 |
| 2006/0103442 | A1 * | 5/2006 | Krueger | G11C 11/4125 327/208 |
| 2020/0244493 | A1 * | 7/2020 | Chen | H04L 25/03057 |

(Continued)

FOREIGN PATENT DOCUMENTS

| | | | | | |
|---|---|---|---|---|---|
| CN | 119449052 | A | * | 2/2025 | H04B 1/04 |
| KR | 20200099453 | A | * | 8/2020 | G11C 7/1048 |

(Continued)

*Primary Examiner* — Seokjin Kim

(74) *Attorney, Agent, or Firm* — Hauptman Ham LLP

(57) ABSTRACT

A system (for determining a lineup amongst a roster of all PFETs and all NFETs that are slaves in a subject group of pull-up-pull-down-inverters (PUDIs) that are coupled in parallel) includes: a comparator to make a comparison between a reference voltage and an output of the subject group. The controller performs: an assessment of a candidate lineup chosen from the roster including setting states of PFET-selection selection signals and NFET-selection signals according to the candidate lineup, and a manipulation based on the comparison including setting the starting-lineup to be the candidate lineup or modifying the candidate lineup and repeating the assessment and manipulation.

20 Claims, 15 Drawing Sheets

(56) References Cited

U.S. PATENT DOCUMENTS

2024/0413834 A1* 12/2024 Kim ........................ H03M 1/50
2025/0119138 A1* 4/2025 Park ....................... H03K 3/037
2025/0125999 A1* 4/2025 Valaee .............. H04L 25/03878

FOREIGN PATENT DOCUMENTS

KR 20240002173 A * 1/2024 ......... H04B 10/6971
KR 20240099764 A * 7/2024 ......... H03K 19/0005

* cited by examiner

437

| Iteration Count (γ) | Candidate Lineup 330(5)(Σ_PFET, Σ_NFET) | Comparator 342 Output | Block 426 |
|---|---|---|---|
| 1 | (1,0) | 1 | Yes |
| 2 | (1,1) | 1 | Yes |
| 3 | (2,1) | 1 | Yes |
| 4 | (2,2) | 1 | Yes |
| 5 | (3,2) | 1 | Yes |
| 6 | (3,3) | 0 | No |
| 7 | (4,4) | n/a | n/a |
| 8 | (4,4) | n/a | n/a |

FIG. 4C

PULL-UP-PULL-DOWN-INVERTER (PUDI), PUDI-BASED SYSTEM FOR CONTINUOUS-TIME LINEAR-EQUALIZATION, AND METHOD OF OPERATING SAME

BACKGROUND

The semiconductor integrated circuit (IC) industry produces a wide variety of analog and digital devices to address issues in a number of different areas. Developments in semiconductor process technology nodes have progressively reduced component sizes and tightened spacing resulting in progressively increased transistor density. ICs have become smaller.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

FIG. 4C is a table, in accordance with some embodiments.

DETAILED DESCRIPTION

Figure 1A:
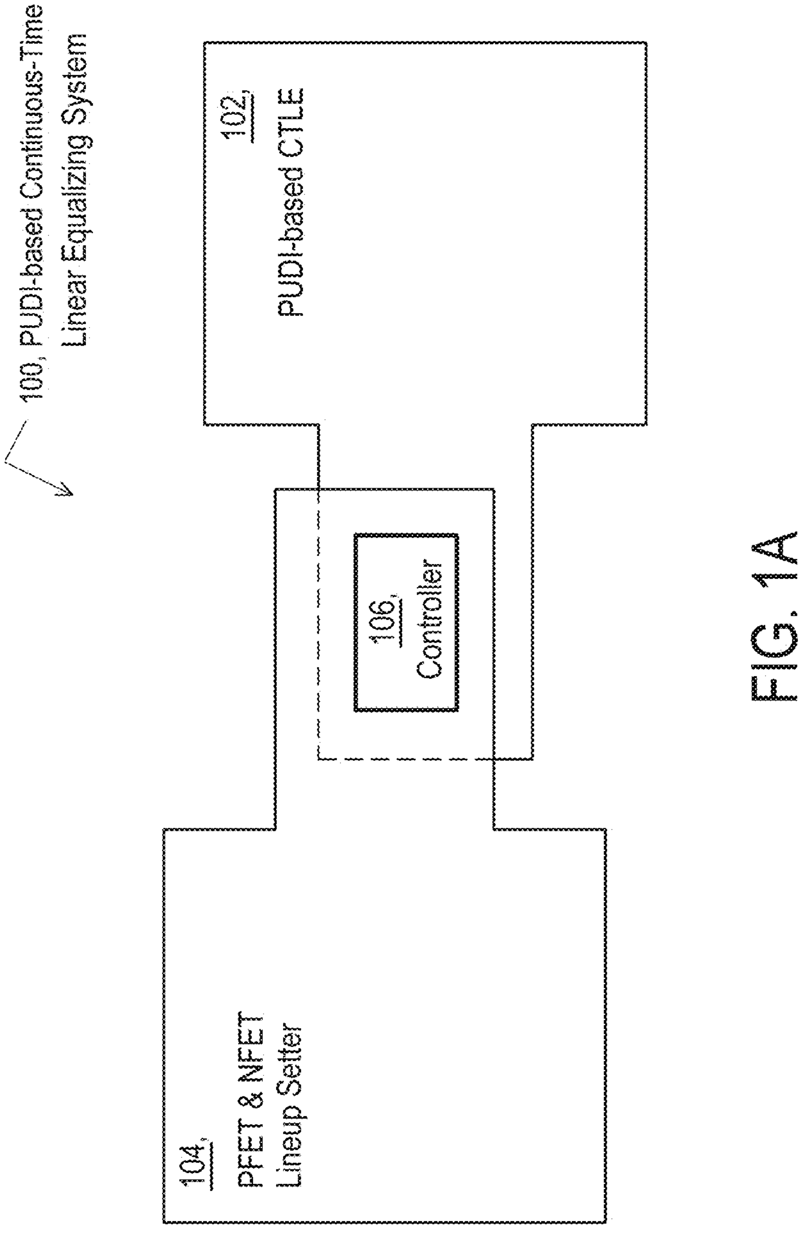
FIG. 1A is a block diagram, in accordance with some embodiments.

The following disclosure discloses many different embodiments, or examples, for implementing different features of the subject matter. Examples of components, materials, values, steps, operations, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows include embodiments in which the first and second features are formed in direct contact, and further include embodiments in which additional features are formed between the first and second features, such that the first and second features are in indirect contact. In addition, the present disclosure repeats reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, are used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus is otherwise oriented (rotated 90 degrees or at other orientations) and the spatially relative descriptors used herein are likewise interpreted accordingly. In some embodiments, the term standard cell structure refers to a standardized building block included in a library of various standard cell structures. In some embodiments, various standard cell structures are selected from a library thereof and are used as components in a layout diagram representing a circuit.

In some embodiments, a PUDI-based continuous-time-linear equalizing system is based on pull-up-pull-down-inverters (PUDIs) (e.g., 108). The PUDI-based system (e.g., 100) is PVTA-adaptive, where the term PVTA is discussed below. System 100 includes a PUDI-based controller (e.g., 106), a PUDI-based continuous-time-linear equalizer (CTLE) (e.g., 102) and a lineup setter (e.g., 104). The controller is included as a part of each of the PUDI-based CTLE and the lineup setter. The PUDI-based CTLE includes groups of PUDIs. The lineup setter is configured to determine/set a lineup of PFETs and/or NFETs. The terms PFET and NFET are discussed below. For a given group of PUDIs, the lineup setter is configured to reduce negative consequences of PVTA variations in the operation of the PUDI-group. For the given group of PUDIs, a listing of all slave PFETs and all slave NFETs in the group represents a roster for the group. The lineup setter is configured to do so by selecting which, if any, amongst the slave PFETs and/or the slave NFETs on the roster are to be enabled for operation, i.e., by determining/setting a lineup of slave PFETs and/or slave NFETs selected from the roster. For the given PUDI-group, the PUDI-based CTLE is configured to execute the lineup (which the lineup setter determined) by enabling operation of one or more of the slave PFETs and/or one or more of the slave NFETs in the PUDI-based CTLE that are included in the lineup, and by preventing the operation of the remaining slave PFETs and/or the slave NFETs that are on the roster but which are not included in the lineup.

Another systemic approach provides a counterpart system that is a counterpart to the PUDI-based continuous-time-linear equalizing system according to some embodiments. The counterpart system includes: a counterpart inverter-based CLTE that is a counterpart to the PUDI-based CTLE according to some embodiments; and a counterpart PVTA-compensator that is a counterpart to the lineup setter according to some embodiments. The counterpart inverter-based CLTE includes groups of tri-state inverters. The counterpart PVTA-compensator attempts to lessen the impact of PVTA variations on the counterpart inverter-based CLTE by performing CTLE-level adaptive control of driving strengths of inverters in the counterpart inverter-based CLTE albeit at a CTLE-level of precision (granularity), the latter being a lower/lesser degree of precision as compared to group-level precision (granularity). The counterpart PVTA-compensator attempts to perform CTLE-level adaptive control by adjusting a ground reference voltage (VSS) provided to all components of the counterpart inverter-based CLTE. The counterpart PVTA-compensator attempts to adjust VSS by using a high speed VSS-manager circuit that includes a high frequency ring oscillator. The high frequency of the VSS-manager circuit according to the other systemic approach:

occupies a larger area (has a large footprint); and suffers high oscillation-dependent current consumption.

By contrast, the PUDI-based CTLE according to some embodiments provides group-level precision (granularity) via the inclusion of groups of PUDIs and consequently achieves more precise (more granular) control and thus better performance (in terms of lessening the impact of PVTA variations) as compared to the CTLE-level precision (granularity) provided according to the other systemic approach. Also by contrast, the lineup setter according to some embodiments is not oscillator-based and thus occupies a substantially smaller area (has a substantially smaller footprint), and suffers substantially lower oscillation-dependent current consumption, as compared to the counterpart PVTA-compensator according to the other systemic approach.

FIG. 1A is a block diagram of a system 100, in accordance with some embodiments.

Figure 1B:
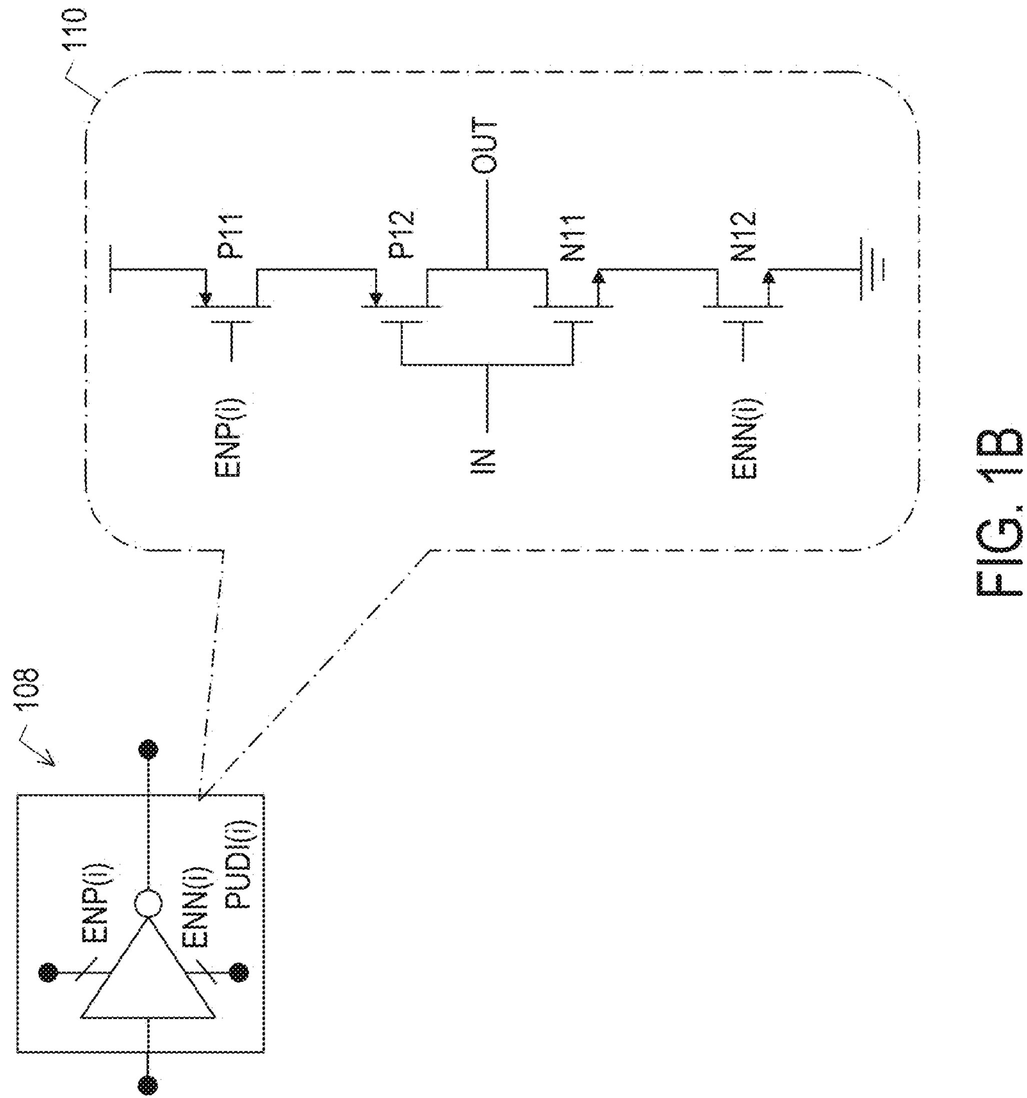
FIG. 1B is schematic diagram, in accordance with some embodiments.

System 100 is a PUDI-based continuous-time-linear equalizing system, i.e., system 100 is based on pull-up-pull-down-inverters (PUDIs) (see FIG. 1B). System 100 is PVTA-adaptive, where the term PVTA (discussed below) is an acronym for PVT and aging variations, and where PVT itself is an acronym for process, supply voltage and temperature variations.

System 100 includes: a controller 106 (see FIGS. 2 and 3A); a PUDI-based continuous-time-linear equalizer (CTLE) 102 (see FIG. 2); and a PFET & NFET lineup setter 104 (sec FIG. 3A), the latter being configured to determine/set a lineup of PFETs and/or NFETs. The terms PFET and NFET are discussed below. Controller 106 is included as a part of each of PUDI-based CTLE 102 and lineup setter 104.

For a given group of PUDIs, a listing of all slave PFETs and all slave NFETs in the group represents a roster for the group. For the given group, lineup setter 104 is configured to select which, if any, amongst the slave PFETs and/or the slave NFETs on the roster are to be enabled for operation, i.e., to determine/set a lineup of slave PFETs and/or slave NFETs selected from the roster. For the given PUDI-group, PUDI-based CTLE 102 is configured to execute the lineup by enabling operation of one or more of the slave PFETs and/or one or more of the slave NFETs that are included in the lineup, and by preventing the operation of the remaining slave PFETs and/or the slave NFETs that are on the roster but which are not included in the lineup.

In some embodiments, lineup setter 104 operates when system 100 powers up and then shuts down. In some embodiments, lineup setter 104 operates when system 100 powers up and then periodically thereafter. In some embodiments, lineup setter 104 operates periodically while system 100 is on.

Each of the terms PFET and NFET assumes a context of field-effect transistors (FETs). The term PFET is an acronym for P-type FET, where a P-type FET is configured with a P-type dopant used for positive-channel metal-oxide semiconductor (PMOS) transistor technologies. The term NFET is an acronym for N-type FET, where an N-type FET is configured with an N-type dopant used for negative-channel metal-oxide semiconductor (NMOS) transistor technologies. For example, complementary metal-oxide semiconductor (CMOS) transistor technology includes PFETs and NFETs.

Regarding the process aspect of PVT, during the fabrication of a semiconductor-based device, e.g., a device that includes PFETs and NFETs, manufacturing tolerances produce variations (process variations) in the device as compared to an idealized design on which the device is based. Examples of process parameters that experience process variations include source-impurity (dopant) concentrations, pressures, temperatures, implanted-impurity (dopant) densities, implanted-impurity (dopant) diffusion depths, oxide thicknesses, transistor channel-widths, transistor channel-lengths, or the like.

Regarding the supply voltage aspect of PVT, supply voltage fluctuations affect the operation of a semiconductor-based device, e.g., a device that includes PFETs and NFETs. Causes of supply voltage fluctuations include ohmic losses, noise due to the rate of change of current (di/dt noise), or the like. Examples of ohmic losses include voltage reductions as currents flow through parasitic resistances of a power grid (IR drops), or the like. Examples of di/dt noise include losses due to parasitic inductances, parasitic capacitances, or the like.

Regarding the temperature aspect of PVT, temperature fluctuations affect the operation of a semiconductor-based device, e.g., a device that includes PFETs and NFETs. The operation of a transistor dissipates power, which generates heat that increases temperature in the proximity of the transistor. Not all PFETs and NFETs experience the same level of activity. Each PFET and NFET contributes a corresponding fluctuation in temperature to the environment of the device. Devices include millions, if not billions, of PFETs and NFETs. Regions of the device which experience high activity amongst significant if not substantial quantities of PFETs and/or NFETs experience significant if not substantial regional temperature fluctuations (sometimes referred to as hot-spots). Among other things, charge-carrier mobility is inversely proportional to temperature, resistance of electrically-conductive paths (wiring) is inversely proportional to temperature, or the like.

Regarding aging, in some embodiments, transistor characteristics of a semiconductor-based device are described as initially having baseline values at the time of fabrication. With the passage of time, the transistor characteristics of the device change, typically worsening as compared to the corresponding baseline values. In some embodiments, the effects of aging are referred to as were-out effects. Example of wear-out effects include an increase in hot carrier injection, bias temperature instability, or the like.

PUDI-based CTLE 102 includes groups (see FIG. 2) of PUDIs. In each such group, the PUDIs are coupled on parallel. Each PUDI includes PFETs and NFETS (see FIG. 1B). The performance of each PUDI, and thus of PUDI-based CTLE 102, is subject to PVTA variations.

Each group of PUDIs (PUDI-group) (see FIG. 2) has a roster that is comprised of all slave PFETs (see FIG. 1B) and all slave NFETs (see FIG. 1B) in the PUDI-group. Because CTLE system 100 is PVTA-adaptive, all slave PFETs (see FIG. 1B) and all slave NFETs (see FIG. 1B) in the PUDI-group are not necessarily enabled to operate. Rather, only selected slave PFETs and selected slave NFETs in the PUDI-group are enabled to operate. The selected slave PFETs and the selected slave NFETs in the PUDI-group represent the lineup of the PUDI-group, i.e., the lineup is selected from the roster.

Each selected slave PFET, i.e., each slave PFET in the lineup, is enabled to operate by the corresponding master PFET. Each slave PFET not in the lineup is prevented from operating by the corresponding master PFET. Each selected slave NFET, i.e., each slave NFET in the lineup, is enabled to operate by the corresponding master NFET. Each slave NFET not in the lineup is prevented from operating by the corresponding master NFET.

For each group of PUDIs, and in terms of being a part of lineup setter 104 (see FIG. 3A), controller 106 is configured to reduce negative consequences of PVTA variations and thereby improve operation of the PUDI-group by determining/setting the lineup. As such, lineup setter 104 is PVTA-adaptive. Also, for each group of PUDIs, and in terms of being a PUDI-based CLTE 102, controller 106 is configured to reduce negative consequences of PVTA variations and thereby improve operation of the PUDI-group by controlling the master PFETs and master NFETTs according to the lineup. As such, PUDI-based CLTE 102 is PVTA-adaptive.

FIG. 1B is a schematic diagram of a PUDI 108, in accordance with some embodiments.

PUDI 108 is an example of each of the PUDIs in the groups thereof included in PUDI-based CTLE 102 of FIG. 1A. Accordingly, PUDI 108 is referred to as an i-th (or i_th) PUDI, i.e., PUDI(i). Control signals received by PUDI(i) 108 are referred to as corresponding i-th (or i_th) control signals.

By way of an exploded view 110, each PUDI(i) 108 includes: a master PFET P11; a slave PFET P12; a slave NFET N11 and a master NFET N12.

Master P11 and slave P12 are coupled in series between a first reference voltage, e.g., VDD, and an output node OUT of PUDI(i) 108. Slave N11 and master N12 are coupled between output node OUT and a second reference voltage, e.g., VSS. A gate terminal of each of slave P12 and slave N11 is coupled to an input node IN of PUDI(i) 108.

A gate terminal of master P11 is configured to receive a PFET-selection signal ENP(i) that is specific to PUDI(i) 108. As such, signal ENP(i) is described as being PUDI-specific. In some embodiments, ENP is an acronym for enable PFET. A gate terminal of master N12 is configured to receive an NFET-selection signal ENP(i) that is specific to PUDI(i) 108. As such, signal ENN(i) is described as being PUDI-specific. In some embodiments, ENN is an acronym for enable NFET. Signals ENP(i) and ENN(i) are generated by controller 106.

Master P11 is controlled by signal ENP(i) to enable or prevent operation of slave P12. Master N12 is controlled by signal ENN(i) to enable or prevent operation of slave N11. For each PUDI(i), master P11 and master N12 are controlled independently of one another such that master P11 and master N12 have one of the following four pair-states: (P11_ON, N12_ON); (P11_ON, N12_OFF); (P11_OFF, N12_ON); and (P11_OFF, N12_OFF). The four pair-states correspond to four modes of operation of PUDI(i) 108, as discussed below.

In an inverter mode, controller 106 configures signal ENP(i) to be in a PFET-active state and signal ENN(i) to be in an NFET-active state which correspondingly turns on master P11 and master N12. When turned on, master P11 enables slave P12 to operate. When turned on, master N12 enables slave N11 to operate. In the inverter mode, PUDI(i) 108 functions as an inverter. The inverter mode corresponds to the pair-state (P11_ON, N12_ON).

In a pull-up mode, controller 106 configures signal ENP (i) to be in the PFET-active state and signal ENN(i) to be in an NFET-inactive state which correspondingly turns on master P11 and turns off master N12. When turned off, master N12 prevents operation of slave N11 such that slave N11 represents a high impedance between input node IN and output node OUT. In the pull-up mode, PUDI(i) 108 functions as a pull-up circuit including: being responsive to a voltage on input node IN that represents a logical low (logical zero) by pulling a voltage on output node OUT up to a value that represents a logical high (logical one); and being unresponsive to a voltage on input node IN that represents a logical high (logical one) by not significantly affecting a value of a voltage on output node OUT. The pull-up mode corresponds to the pair-state (P11_ON, N12_OFF).

In a pull-down mode, controller 106 configures signal ENP(i) to be in a PFET-inactive state and signal ENN(i) to be in the NFET-active state which correspondingly turns off master P11 and turns on master N12. When turned off, master P11 prevents operation of slave P12 such that slave P12 represents a high impedance between input node IN and output node OUT. In the pull-down mode, PUDI(i) 108 functions as a pull-down circuit including: being responsive to a voltage on input node IN that represents a logical high (logical one) by pulling a voltage on output node OUT down to a value which represents a logical low (logical zero); and being unresponsive to a voltage on input node IN that represents a logical low (logical zero) by not significantly affecting a value of a voltage on output node OUT. The pull-down mode corresponds to the pair-state (P11_OFF, N12_ON).

In a high-impedance mode, controller 106 configures signal ENP(i) to be in a PFET-inactive state and signal ENN(i) to be in an NFET-inactive state which correspondingly turns off master P11 and master N12. In the high-impedance mode, PUDI(i) 108 represents a high impedance between input node IN and output node OUT irrespective of whether a voltage on input node IN represents a logical low (logical zero) or a logical high (logical one). The high-impedance mode corresponds to the pair-state (P11_OFF, N12_OFF).

According to the other systemic approach, a tri-state inverter is a counterpart to PUD(i) 108. The counterpart tri-state inverter includes a counterpart to master P11, a counterpart to slave P12, a counterpart to master N12 and a counterpart to slave N11 of PUD(i) 108. The counterpart to master P11 and the counterpart to master N12 according to the other systemic approach can have only two pair-states, namely (counterpart_P11_ON, counterpart_N12_ON) and (counterpart_P11_OFF, counterpart_N12_OFF). As such, the counterpart tri-state inverter has only two odes of operation, namely an inverter mode or a high-impedance mode. By contrast, PUDI(i) 108 had four modes of operation according to some embodiments, i.e., two additional modes of operation as compared to the counterpart tri-state inverter according to the other systemic approach. The two extra modes of operation facilitate greater operational flexibility by PUDI(i) 108 according to some embodiments as compared to the counterpart tri-state inverter according to the other systemic approach. The two extra modes of operation facilitate greater operational flexibility by PUDI(i) 108 according to some embodiments facilitates: controller 106, in the context of lineup setter 104 (see FIG. 3A), being configured to reduce negative consequences of PVTA variations and thereby improve operation of a PUDI-group by determining/setting a corresponding lineup; and controller 106, in the context of PUDI-based CLTE 102, being configured to reduce negative consequences of PVTA variations and thereby improve operation of a PUDI-group by controlling master PFETs and master NFETTs according to the corresponding lineup.

Figure 1C:
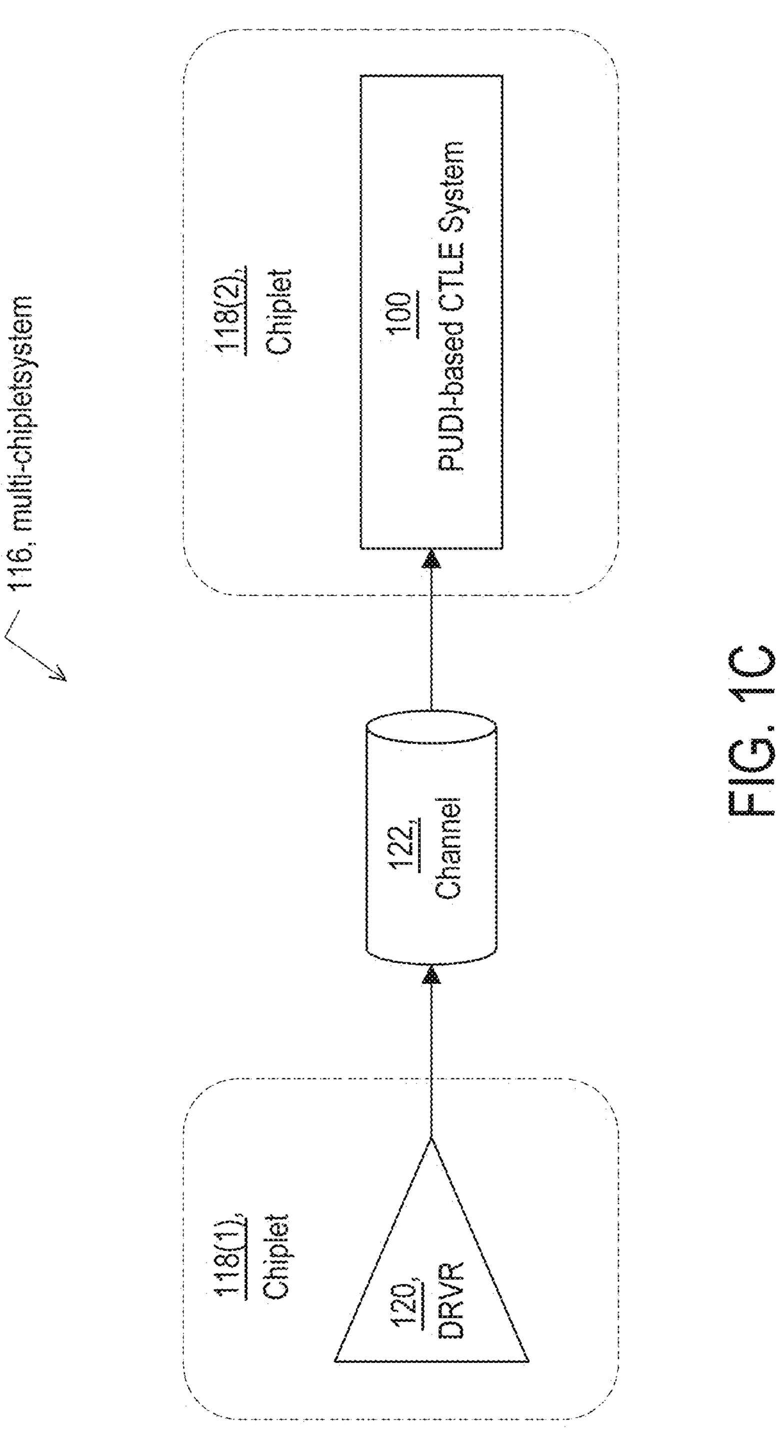
FIG. 1C is a block diagram, in accordance with some embodiments.

FIG. 1C is a block diagram of a system 116, in accordance with some embodiments.

System 116 is a multi-chiplet system. In some embodiments, chiplets are the result of disassembling (or decomposing or breaking apart) a system-on-chip (SOC) into components representing corresponding elemental functions.

System 116 includes chiplet 118(1) and 118(2) and a channel 122. Chiplet 118(1) includes, among other things, a driver 120. Chiplet 118(2) includes, among other things, PUDI-based CTLE system 100. Driver 120 is coupled to CTLE system 100 by channel 122. Chiplet 118(1) uses driver 120 to communicate with, i.e., send signals to, chiplet 118(2), and chiplet 118(2) uses CTLE system 100 to receive signals from chiplet 118(1). In some embodiments, channel 122 is a high bandwidth serial transmission line.

In some embodiments, chiplet 118(1) includes a processor (not shown) and chiplet 118(2) includes a compute-in-memory (CIM) system (not shown). In such embodiments, the processor of chiplet 118(1) communicates with the CIM system of chiplet 118(2) via driver 120, channel 122 and CTLE system 100.

In some embodiments, chiplet 118(1) includes a compute-in-memory (CIM) system (not shown) and chiplet 118(2) includes a processor (not shown). In such embodiments, the CIM system of chiplet 118(1) communicates with the processor of chiplet 118(2) via driver 120, channel 122 and CTLE system 100.

In some embodiments, chiplet 118(1) includes a second instance (not shown) of CTLE system 100 and chiplet 118(2) includes a second instance (not shown) of driver 120. In some embodiments, multi-chiplet system 116 is an artificial intelligence (AI) system.

In some embodiments, reference voltages of chiplet 118 (1) are substantially the same as corresponding reference voltages of chiplet 118(2). For example, in some embodiments, reference voltages VDD and VSS of chiplet 118(1) are substantially the same as reference voltages VDD and VSS of chiplet 118(2). In such embodiments, chiplets 118(1) and 118(2) are described as being tightly coupled. In some embodiments in which chiplet 118(1) is tightly coupled with chiplet 118(2), VDD≈0.80 volts, VDD≈0.70 volts, or the like. In an otherwise tightly coupled scenario, PVTA variations reduce an extent to which chiplets 118(1) and 118(2) are tightly coupled.

In some embodiments, one or more reference voltages of chiplet 118(1) are significantly if not substantially different than corresponding reference voltages of chiplet 118(2). For example, in some embodiments, (A) chiplet 118(1) has VDD≈0.85 volts and chiplet 118(2) has VDD≈0.75 volts or vice-versa, (B) chiplet 118(1) has VDD≈0.75 volts and chiplet 118(2) has VDD≈0.65 volts or vice-versa, or the like. In such embodiments, chiplets 118(1) and 118(2) are described as being non-tightly coupled. In a non-tightly coupled scenario, PVTA variations typically exaggerate an extent to which chiplets 118(1) and 118(2) are non-tightly coupled.

Figure 2:
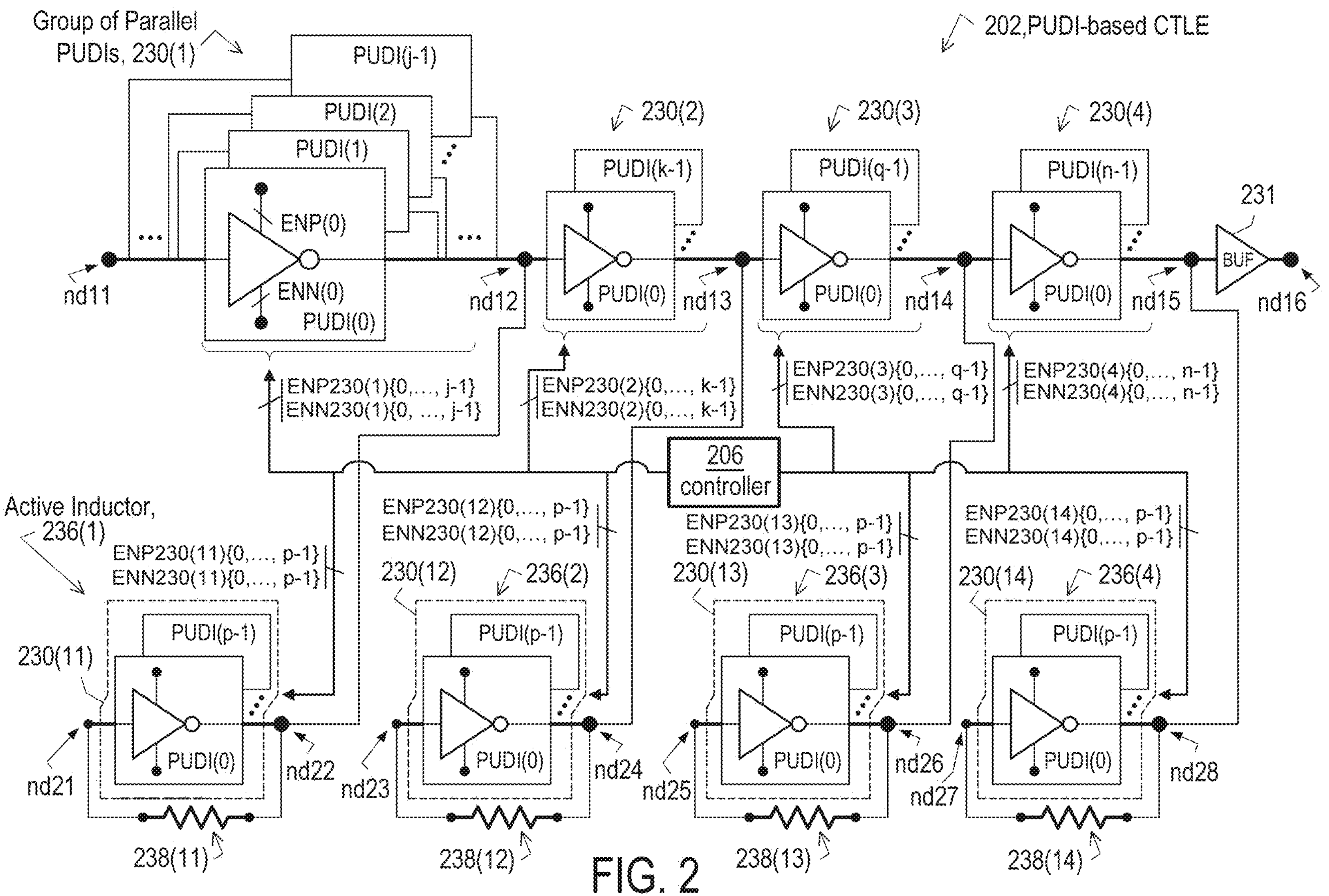
FIG. 2 is a schematic diagram, in accordance with some embodiments.

FIG. 2 is a schematic diagram of a PUDI-based CTLE 202, in accordance with some embodiments.

PUDI-based CTLE 202 is an example of PUDI-based CTLE 102 of FIG. 1A. Thus, in some embodiments, PUDI-based CTLE 102 is included in a PUDI-based system, e.g., system 100 of FIG. 1A. In such embodiments of systems, CTLE 202 is jointly present with a lineup setter, e.g., lineup setter 104 of FIG. 1A.

For a given lineup of PUDIs amongst a given group of PUDIs, CTLE 202 is configured to execute the lineup as follows: by enabling operation of one or more of the slave PFETs and/or one or more of the slave NFETs that are included in the lineup; and by preventing the operation of the remaining slave PFETs and/or the slave NFETs that are on the roster but which are not included in the lineup. The given lineup is determined by a lineup setter, e.g., lineup setter 104 of FIG. 1A, lineup setter 304 of FIG. 3A, or the like.

PUDI-based CTLE 202 includes: groups 230(1)-230(4) of PUDIs; groups of active inductors 236(1)-236(4); a buffer 231; and a controller 206. Each PUDI in PUDI-groups 230(1)-230(4) is an example of PUDI(i) 108 of FIG. 1B. Controller 206 is an example of controller 106 of FIG. 1A.

PUDI-groups 230(1)-230(4) are coupled in series between a node nd11 and a node nd15. PUDI-group 230(1) is coupled between node nd11 and a node nd12. Node nd11 represents an input node of PUDI-based CTLE 202. PUDI-group 230(2) is coupled between node nd12 and a node nd13. PUDI-group 230(3) is coupled between node nd13 and a node nd14. PUDI-group 230(4) is coupled between node nd14 and node nd15. Buffer 231 is coupled between node nd15 and a node nd16. Node nd16 represents an output node of PUDI-based CTLE 202.

In FIG. 2, the PUDIs in each of PUDI-groups 230(1)-230 (4) are examples of PUDI(i) 108 of FIG. 1B. PUDI-group 230(1) includes j PUDIs, i.e., PUDI(0), . . . , PUDI(j−1), coupled in parallel between nodes nd11 and nd12, where j is a positive integer. In some embodiments, j=16. The PUDIs of PUDI-group 230(1) are configured correspondingly to receive PFET-selection signals ENP230(1){0, . . . , j−1} and NFET-selection signals ENN230(1){0, . . . , j−1} from controller 206 that are group-specific and intra-group-PUDI-specific. Controller 206 configures signals ENP230(1) {0, . . . , j−1} and ENN230(1){0, . . . , j−1} to be correspondingly in active or inactive states according to a lineup for PUDI-group 230(1) that has been determined by controller 206 (sec FIG. 3A).

PUDI-group 230(2) includes k PUDIs, i.e., PUDI(0), . . . , PUDI(k−1), coupled in parallel between nodes nd12 and nd13, where k is a positive integer. In some embodiments, k=8. The PUDIs of PUDI-group 230(2) are configured correspondingly to receive PFET-selection signals ENP230(2){0, . . . , k−1} and NFET-selection signals ENN230(2){0, . . . , k−1} from controller 206 that are group-specific and intra-group-PUDI-specific. Controller 206 configures signals ENP230(2){0, . . . , k−1} and ENN230(2){0, . . . , k−1} to be correspondingly in active or inactive states according to a lineup for PUDI-group 230(2) that has been determined by controller 206 (see FIG. 3A).

PUDI-group 230(3) includes q PUDIs, i.e., PUDI(0), . . . , PUDI(q−1), coupled in parallel between nodes nd13 and nd14, where q is a positive integer. In some embodiments, q=8. The PUDIs of PUDI-group 230(3) are configured correspondingly to receive PFET-selection signals ENP230(3){0, . . . , q−1} and NFET-selection signals ENN230(1){0, . . . , q−1} from controller 206 that are group-specific and intra-group-PUDI-specific. Controller 206 configures signals ENP230(3){0, . . . , q−1} and ENN230(3){0, . . . , q−1} to be correspondingly in active or inactive states according to a lineup for PUDI-group 230(3) that has been determined by controller 206 (see FIG. 3A).

PUDI-group 230(4) includes n PUDIs, i.e., PUDI(0), . . . , PUDI(n−1), coupled in parallel between nodes nd14 and nd15, where n is a positive integer. In some embodiments, n=8. The PUDIs of PUDI-group 230(4) are configured correspondingly to receive PFET-selection signals ENP230(4){0, . . . , n−1} and NFET-selection signals ENN230(4){0, . . . , n−1} from controller 206 that are group-specific and intra-group-PUDI-specific. Controller 206 configures signals ENP230(4){0, . . . , n−1} and ENN230(3){0, . . . , n−1} to be correspondingly in active or inactive states according to a lineup for PUDI-group 230(4) that has been determined by controller 206 (see FIG. 3A).

In FIG. 2, each of active inductors 236(1)-236(4) correspondingly includes a PUDI-group and a resistor. The PUDIs in each of active inductors 236(1)-236(4) are examples of PUDI(i) 108 of FIG. 1B. Active inductor 236(1) includes a PUDI-group 230(11) and a resistor 238(11). Resistor 238(11) and the PUDIs of PUDI-group 230(11) are coupled in parallel between nodes nd21 and nd22. Node nd22 is coupled to node nd12. PUDI-group 230(11) includes p PUDIs, i.e., PUDI(0), . . . , PUDI(p−1), where p is a positive integer. In some embodiments, p=4.

The PUDIs of PUDI-group 230(11) are configured correspondingly to receive PFET-selection signals ENP230(11){0, . . . , p−1} and NFET-selection signals ENN230(11){0, . . . , p−1} from controller 206 that are group-specific and intra-group-PUDI-specific. Controller 206 configures signals ENP230(11){0, . . . , p−1} and ENN230(11){0, . . . , p−1} to be correspondingly in active or inactive states according to a lineup for PUDI-group 230(11) that has been determined by controller 206 (see FIG. 3A).

Active inductors 236(2)-236(4) (discussed below) are duplicates of active inductor 236(1). The PUDI-groups in active inductors 236(2)-236(4) are duplicates of PUDI-group 230(11). The resistors in active inductors 236(2)-236(4) are duplicates of resistor 238(11).

Active inductor 236(2) includes a PUDI-group 230(12) and a resistor 238(12). Resistor 238(12) and the PUDIs of PUDI-group 230(12) are coupled in parallel between nodes nd23 and nd24. Node nd24 is coupled to node nd13. PUDI-group 230(12) includes p PUDIs, i.e., PUDI(0), . . . , PUDI(p−1).

The PUDIs of PUDI-group 230(12) are configured correspondingly to receive PFET-selection signals ENP230(12){0, . . . , p−1} and NFET-selection signals ENN230(12){0, . . . , p−1} from controller 206 that are group-specific and intra-group-PUDI-specific. Controller 206 configures signals ENP230(12){0, . . . , p−1} and ENN230(12){0, . . . , p−1} to be correspondingly in active or inactive states according to a lineup for PUDI-group 230(12) that has been determined by controller 206 (see FIG. 3A).

Active inductor 236(3) includes a PUDI-group 230(13) and a resistor 238(13). Resistor 238(13) and the PUDIs of PUDI-group 230(13) are coupled in parallel between nodes nd25 and nd26. Node nd26 is coupled to node nd14. PUDI-group 230(13) includes p PUDIs, i.e., PUDI(0), . . . , PUDI(p−1).

The PUDIs of PUDI-group 230(13) are configured correspondingly to receive PFET-selection signals ENP230(13){0, . . . , p−1} and NFET-selection signals ENN230(13){0, . . . , p−1} from controller 206 that are group-specific and intra-group-PUDI-specific. Controller 206 configures signals ENP230(13){0, . . . , p−1} and ENN230(13){0, . . . , p−1} to be correspondingly in active or inactive states according to a lineup for PUDI-group 230(13) that has been determined by controller 206 (sec FIG. 3A).

Active inductor 236(4) includes a PUDI-group 230(14) and a resistor 238(14). Resistor 238(14) and the PUDIs of PUDI-group 230(14) are coupled in parallel between nodes nd27 and nd28. Node nd28 is coupled to node nd15. PUDI-group 230(14) includes p PUDIs, i.e., PUDI(0), . . . , PUDI(p−1).

The PUDIs of PUDI-group 230(14) are configured correspondingly to receive PFET-selection signals ENP230(14){0, . . . , p−1} and NFET-selection signals ENN230(14){0, . . . , p−1} from controller 206 that are group-specific and intra-group-PUDI-specific. Controller 206 configures signals ENP230(14){0, . . . , p−1} and ENN230(14){0, . . . , p−1} to be correspondingly in active or inactive states according to a lineup for PUDI-group 230(14) that has been determined by controller 206 (see FIG. 3A).

According to the other systemic approach, a counterpart to PUDI-based CTLE 202 is an inverter-based CTLE. The counterpart CTLE includes groups of parallel-coupled tri-state inverters that are counterparts to the PUDI-groups, e.g., 230(1), of PUDI-based CTLE 202. The tri-state inverters of the counterpart CTLE are examples of the tri-state inverters according to the other systemic approach (discussed above). The other systemic approach attempts to lessen the impact of PVTA variations on the counterpart CTLE by adjusting a ground reference voltage, i.e., VSS, for all of the counterpart groups of counterpart inverters as a whole. However, not all counterpart groups of counterpart inverters according to the other systemic approach exhibit PVTA-variations to the same degree. As such, the CTLE-level precision (granularity) according to the other systemic approach limits the overall effectiveness at lessening the impact of PVTA variations achieved by the counterpart to CTLE. By contrast, controller 206 provides not only group-level precision (granularity) via the use of group-specific PFET-selection signals and NFET selection signals, but also provides PUDI-level precision (granularity) via the use of intra-group-PUDI-specific PFET-selection signals and intra-group-PUDI-specific NFET selection signals. As a result, PUDI-based CTLE 202 achieves more precise (more granular) control and thus better performance (in terms of lessening the impact of PVTA variations) as compared to the CTLE-level precision (granularity) provided by the counterpart inverter-based CTLE according to the other systemic approach.

Putting aside the high-impedance mode, according to the other systemic approach, all counterparts to slave P12 and all counterparts to slave N11 of PUD(i) 108 are enabled for operation and correspondingly consume power. By contrast, PUDI-based CTLE 202 typically has a CTLE-level lineup that represents fewer than all slave PFETs and all slave NFETs on the CTLE-lever roster such that fewer than all slave PFETs and all slave NFETs correspondingly consumer power. As a result, PUDI-based CTLE 202 typically consumes less power as compared to the counterpart to CTLE according to the other systemic approach.

Figure 3A:
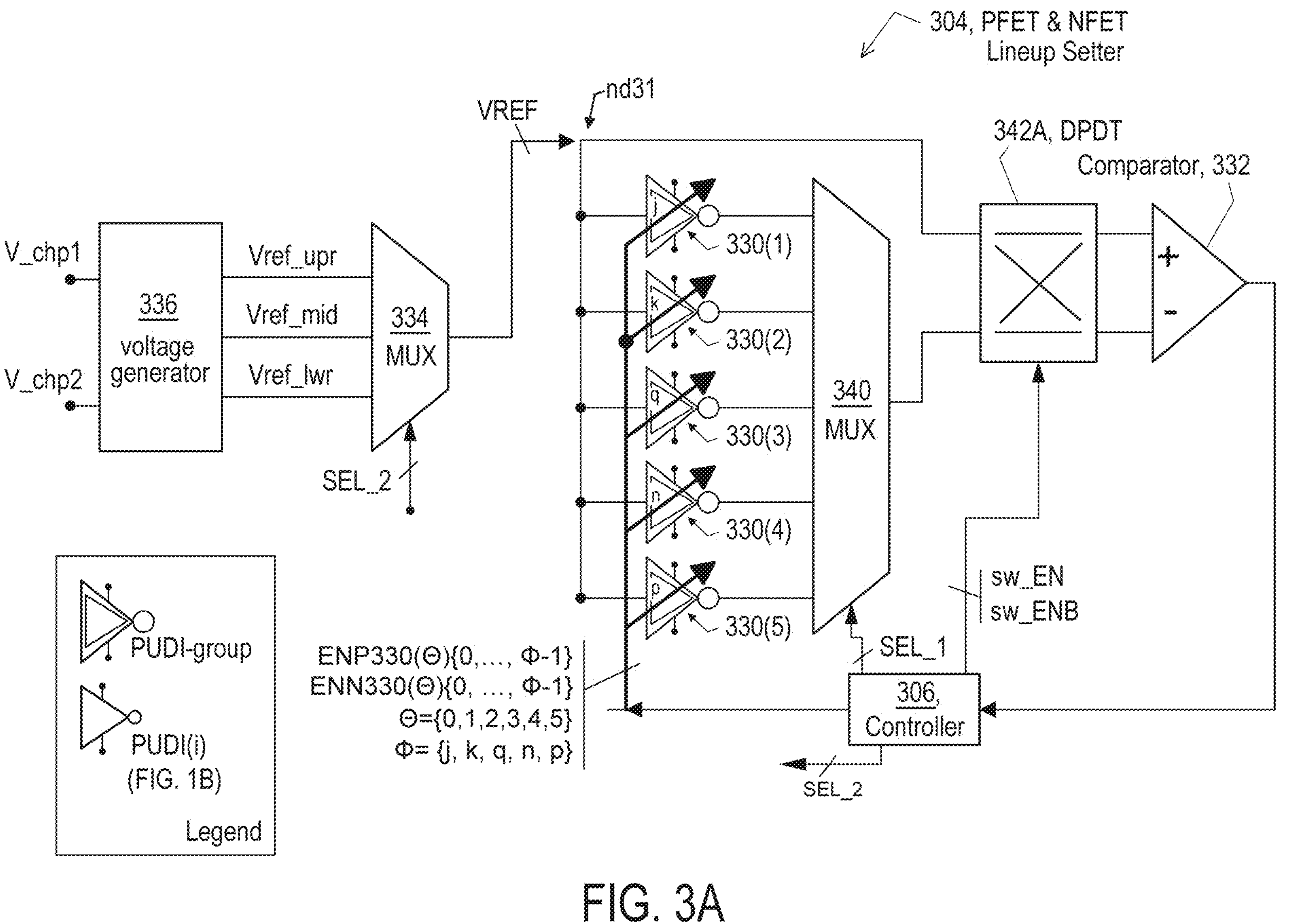
FIGS. 3A-3D are corresponding schematic diagrams, in accordance with some embodiments.

FIG. 3A is a schematic diagram of a PFET & NFET lineup setter 304, in accordance with some embodiments.

Lineup setter 304 is an example of lineup setter 104 of FIG. 1A. Thus, in some embodiments, lineup setter 304 is included in a PUDI-based system, e.g., system 100 of FIG. 1A. In such embodiments of systems, lineup setter 304 is jointly present with a PUDI-based CTLE, e.g., CTLE 102 of FIG. 1A.

For a given group of PUDIs that has a roster representing all slave PFETs and all slave NFETs in the group, lineup setter 304 is configured to select which, if any, amongst the slave PFETs and/or the slave NFETs on the roster are to be enabled for operation, i.e., to determine/set a lineup of slave PFETs and/or slave NFETs selected from the roster. The lineup determined by lineup setter 304 is executed by a corresponding PUDI-based CTLE, e.g., PUDI-based CTLE 102 which is also included in PUDI-based system 100 of FIG. 1A.

Lineup setter 304 includes: groups 330(1)-330(4) of PUDIs; a multiplexer (MUX) 340; a double-pole double-throw (DPDT) switching circuit 342A; a comparator 332; a MUX 334; a voltage generator 336 and controller 306; and a controller 306. Each PUDI in PUDI-groups 330(1)-330(4) is an example of PUDI(i) 108 of FIG. 1B. Controller 306 is an example of controller 306 of FIG. 1A. For the purpose of brevity going forward, a DPDT switching circuit will be referred to in the specification as a DPDT, e.g., DPDT switching circuit 342A will be referred to in the specification as DPDT 342A going forward.

PUDI-groups 330(1)-330(4) are corresponding duplicates (or clones) of PUDI-groups in a corresponding PUDI-based CTLE. For example, PUDI-groups 330(1)-330(4) are corresponding duplicates of PUDI-groups 230(1)-230(4) of CTLE 202 of FIG. 2. As such, the PUDIs in each of groups 330(1)-330(4) are examples of PUDI(i) 108 of FIG. 1B. Also as such: PUDI-group 330(1) includes j PUDIs; PUDI-group 330(2) includes k PUDIs; PUDI-group 330(3) includes q PUDIs; and PUDI-group 330(4) includes n PUDIs. PUDI-group 330(5) represents a duplicate (or clone) of each of PUDI-groups 230(11)-230(14) of CTLE 202 of FIG. 2. As such, the PUDIs in group 330(5) are examples of PUDI(i) 108 of FIG. 1B. Also as such: PUDI-group 330(5) includes p PUDIs.

DPDT 342A (sec FIGS. 3B-3D) includes first and second inputs and first and second outputs. The first input of DPDT 342A is coupled to a node nd31, where node nd31 has a reference voltage VREF (discussed below in the context of voltage generator 336 and mux 334). The second input of DPDT 342A is coupled to an output of MUX 340. The first and second outputs of DPDT 342A are correspondingly coupled to non-inverting and inverting inputs of comparator 332. The output of comparator 332 is coupled to an input of controller 306.

MUX 340 has five inputs coupled correspondingly to the outputs of PUDI-groups 330(1)-330(5). The input of each of PUDI-groups 330(1)-330(5) is coupled to node nd31.

MUX 340 is configured to receive a selection signal SEL_1 from controller 306 according to which MUX 340 is controlled to switch/provide the output of one of PUDI-groups 330(1)-330(5) to the second input of DPDT 342A.

PUDI-groups 330(1)-330(5) are configured to receive corresponding PFET-selection signals ENP330(Θ){0, . . . , Φ−1} and NFET-selection signals ENN330(Θ){0, . . . , Φ−1} from controller 306, where Θ and Φ are corresponding positive integers, Θ={0,1,2,3,4,5}, and Φ={j, k, q, n, p}. For example, PUDI-group 330(1) receives signals ENP330(1){0, . . . , j−1} and NFET-selection signals ENN330(1){0, . . . , j−1}.

DPDT 342A is configured to receive switch control signals sw_EN and sw_ENB from controller 306. According to signals sw_EN and sw_ENB, DPDT 342A is controlled (see FIGS. 3B-3D) to route signals in one of two ways correspondingly referred to as an alpha mode of routing and a beta mode of routing. In some embodiments, the alpha and beta modes are described as being invoked by controller 306. In the alpha mode, the first and second inputs of DPDT 342A are coupled correspondingly to the first and second outputs of DPDT 342A. In the beta mode, the first and second inputs of DPDT 342A are coupled correspondingly to the second and first outputs of DPDT 342A. In some embodiments, the beta mode is described as the converse of the alpha mode. The alpha and beta modes are mutually exclusive.

Figures 3B, 3C:
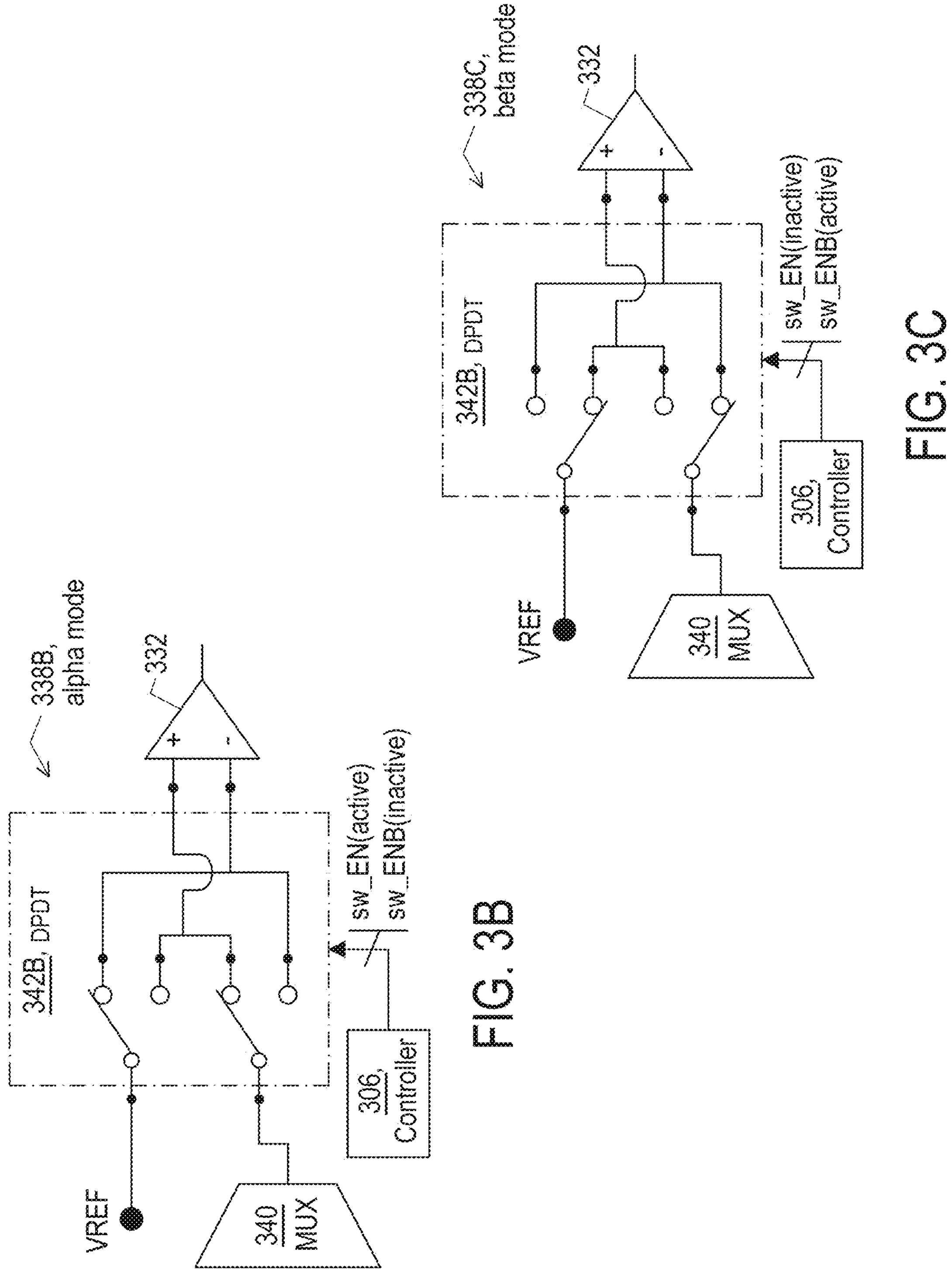
Figure 3D:
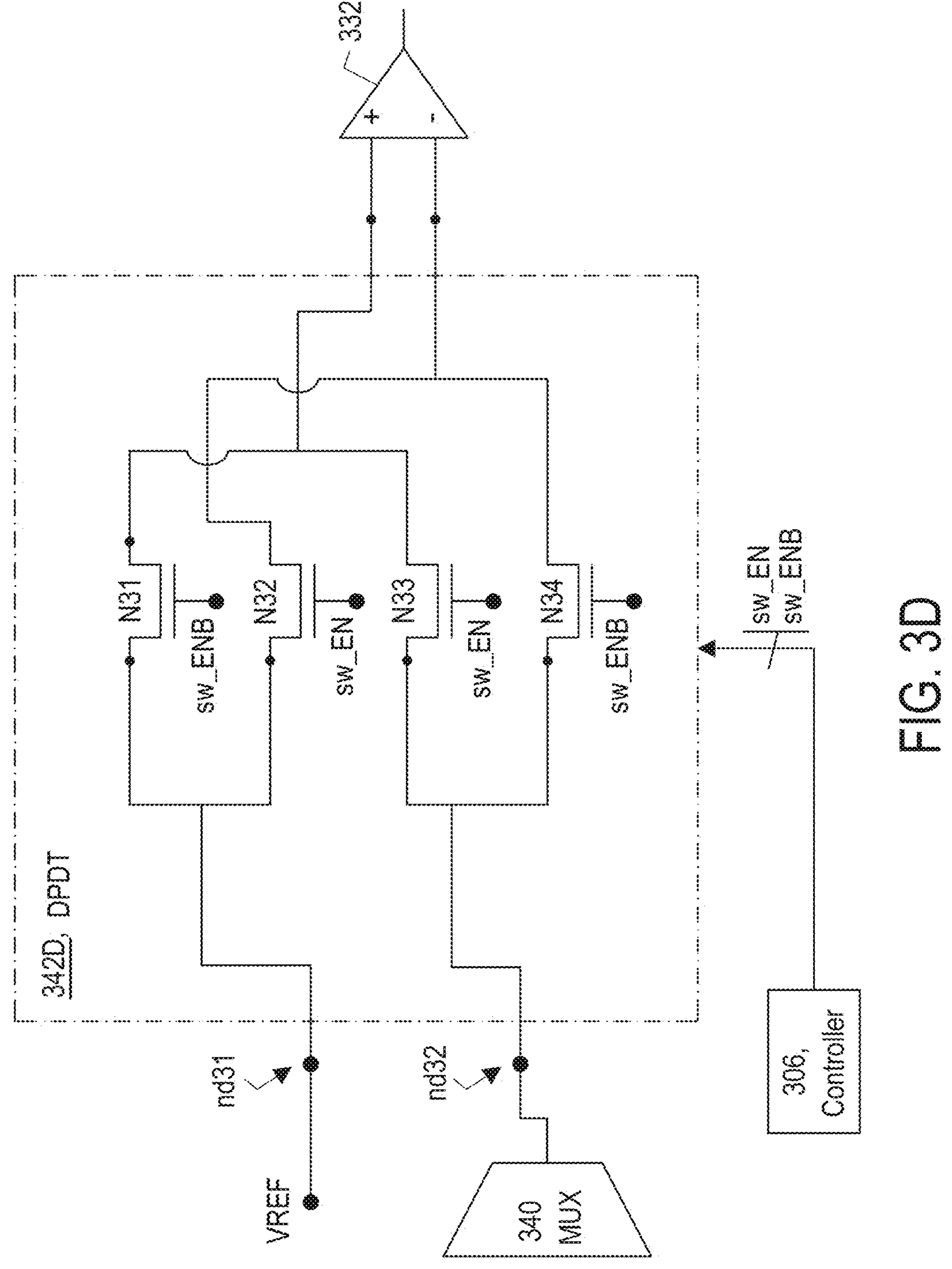

Before discussing other aspects of FIG. 3A, DPDT 342A will be considered in more detail by discussing FIGS. 3B-3D.

FIGS. 3B and 3C are corresponding schematic diagrams of a DPDT 342B, in accordance with some embodiments.

DPDT 342B is an example of DPDT 342A of FIG. 3A. FIGS. 3A-3B correspondingly illustrate signal paths for alpha mode 338B and beta mode 338C of DPDT 342B.

In alpha mode 338B of FIG. 3B, signals sw_EN and sw_ENB are configured correspondingly to be in an active state and an inactive state. In the alpha mode, VREF is coupled to the inverting input of comparator 332 and the output of MUX 340 is coupled to the non-inverting input of comparator 332.

In beta mode 338C of FIG. 3C, signals sw_EN and sw_ENB are configured correspondingly to be in an inactive state and an active state. In the beta mode, VREF is coupled to the non-inverting input of comparator 332 and the output of MUX 340 is coupled to the inverting input of comparator 332.

FIG. 3D is a transistor-level schematic diagram of a DPDT 342D, in accordance with some embodiments.

DPDT 342D is an example of DPDT 342A of FIG. 3A. DPDT 342D includes NFETs N31, N32, N33 and N34. In some embodiments, one or more of NFETs N31-N34 is/are replaced by corresponding PFETs P31-P34 (not shown).

NFET N31 is coupled between node nd31 and the non-inverting input of comparator 332. Again, node nd31 has voltage VREF. NFET N32 is coupled between node nd31 and the inverting input of comparator 332. NFET N33 is coupled between the output of MUX 340 and the non-inverting input of comparator 332. NFET N34 is coupled between the output of MUX 340 and the inverting input of comparator 332. The gate terminal of each of NFETs N32 and N33 is configured to receive signal sw_EN. The gate terminal of each of NFETs N31 and N34 is configured to receive signal sw_ENB.

Returning to the discussion of FIG. 3A, the value of VREF selected by controller 306, i.e., the value of VREF received at the first input of DPDT 342A and at the input of each of PUDI-groups 330(1)-330(5), depends upon whether lineup setter 304 is operating in a context of a tightly coupled scenario or a non-tightly coupled scenario.

It is to be recalled, in some embodiments, that (i) lineup setter 304 is included in a PUDI-based system such as PUDI-based system 100 of FIG. 1A and (ii) system 100 is included in chiplet 118(2) of multi-chiplet system 116 of FIG. 1C. In such embodiments of systems, lineup setter 304 is jointly present with a PUDI-based CTLE, e.g., 102. In such embodiments, chiplets 118(1) and 118(2) are either tightly coupled or non-tightly coupled. Accordingly, voltage generator 336 and MUX 334 are included in lineup setter 304 to accommodate whether (i) chiplets 118(1) and 118(2) are tightly coupled or (ii) chiplets 118(1) and 118(2) being non-tightly coupled. Because each of the tightly-coupled and non-tightly coupled scenarios is affected by PVTA variations (as discussed above), the inclusion of voltage generator 336, MUX 334 and the associated functionality of controller 306 informs, in part, a description of lineup setter 304 as being PVTA-adaptive.

Voltage generator 336 is configured to receive: a reference voltage V_chp1 from a first chiplet, e.g., chiplet 118(1) of FIG. 1A. and a reference voltage V_chp2 from a second chiplet, e.g., chiplet 118(2) of FIG. 1A, where lineup setter 304 is included in the second chiplet. Voltage generator 336 is configured to generate reference voltages Vref_upr, Vref_mid and Vref_lwr.

MUX 334 is configured to receive voltages Vref_upr, Vref_mid and Vref_lwr from voltage generator 336. MUX 334 is configured to receive a selection signal SEL_2 from controller 306 according to which MUX 334 is controlled to switch/provide one of voltages Vref_upr, Vref_mid and Vref_lwr to node nd31.

Regarding the non-tightly coupled scenario, in some embodiments, controller 306 is configured to select the value for VREF as follows: when determining the lineup for PUDI-group 330(1), VREF is made equal to Vref_upr; when determining the lineup for PUDI-group 330(2), VREF is made equal to Vref_lwr; and when determining the lineups for each of PUDI-groups 330(3)-330(5), VREF is made equal to Vref_mid. In some embodiments, the use of Vref_upr for PUDI-group 330(1) and Vref_lwr for PUDI-group 330(2) is described more specifically as an accommodation of the difference between Vchp1 and Vchp2.

A first example of the non-tightly coupled scenario is Vchp1≈0.85 volts and Vchp2≈0.75 volts. Regarding the first example, in some embodiments, voltage generator 336 is configured to generate Vref_upr, Vref_mid and Vref_lwr as follows: Vref_upr=(Vchp2/2)+(Vchp1−Vchp2)/4; Vref_mid=(Vchp2/2); and Vref_lwr=(Vchp2/2)−(Vchp1−Vchp2)/4.

Regarding the first example of the non-tightly coupled scenario, in some embodiments, voltage generator 336 is configured swap the calculations of Vref_upr and Vref_lwr and thereby generate Vref_upr, Vref_mid and Vref_lwr as follows: Vref_upr=(Vchp2/2)−(Vchp1—Vchp2)/4; Vref_mid=(Vchp2/2); and Vref_lwr=(Vchp2/2)+−(Vchp1−Vchp2)/4.

A second example of the non-tightly coupled scenario is Vchp1≈0.75 volts and Vchp2≈0.65 volts. Regarding the second example, in some embodiments, voltage generator 336 is configured to generate Vref_upr, Vref_mid and Vref_lwr as follows. Vref_upr=(Vchp2/2)+(Vchp1−Vchp2)/3; Vref_mid=(Vchp2/2); and Vref_lwr=(Vchp2/2)−(Vchp1—Vchp2)/3.

Regarding the second example of the non-tightly coupled scenario, in some embodiments, voltage generator 336 is configured to swap the equations for Vref_upr and Vref_lwr and thereby generate Vref_upr, Vref_mid and Vref_lwr as follows. Vref_upr=(Vchp2/2)−(Vchp1−Vchp2)/3; Vref_mid=(Vchp2/2); and Vref_lwr=(Vchp2/2)+−(Vchp1−Vchp2)/3.

Regarding a tightly coupled scenario, Vchp1 is substantially equal to Vchp1 such that a version of Vref_mid based on Vchp1 is substantially equal to a version of Vref_mid based on Vchp2. In some embodiments, controller 306 is configured to select VREF to be equal to Vref_mid when determining the lineups for each of PUDI-groups 330(1)-330(5). In some embodiments, voltage generator 336 is configured to generate Vref_mid=(Vchp2/2). In some embodiments, voltage generator 336 is configured to generate Vref_mid=(Vchp1/2).

Figure 4A:
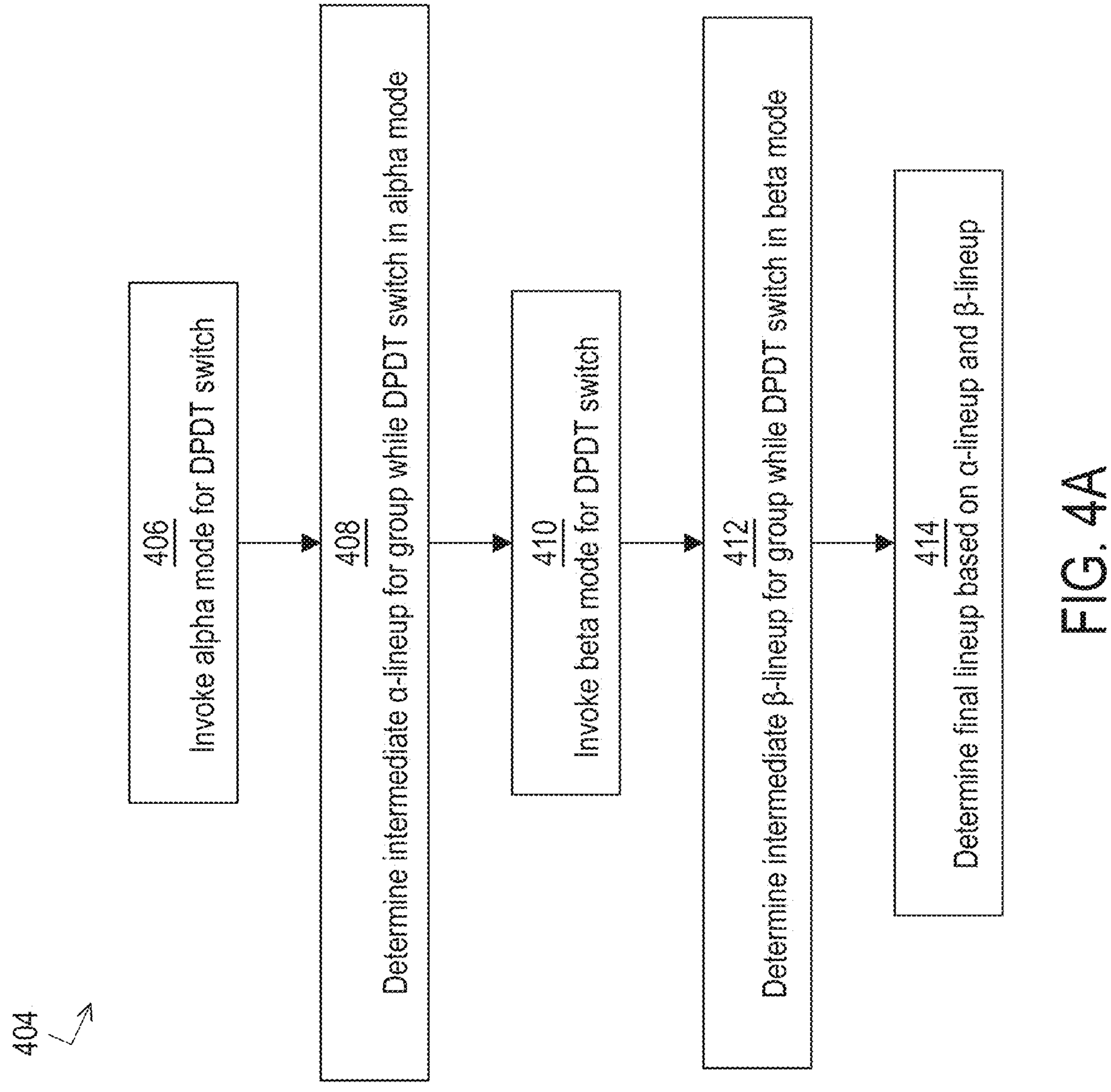
FIGS. 4A-4B are flowcharts of corresponding methods, in accordance with some embodiments.
Figure 4B:
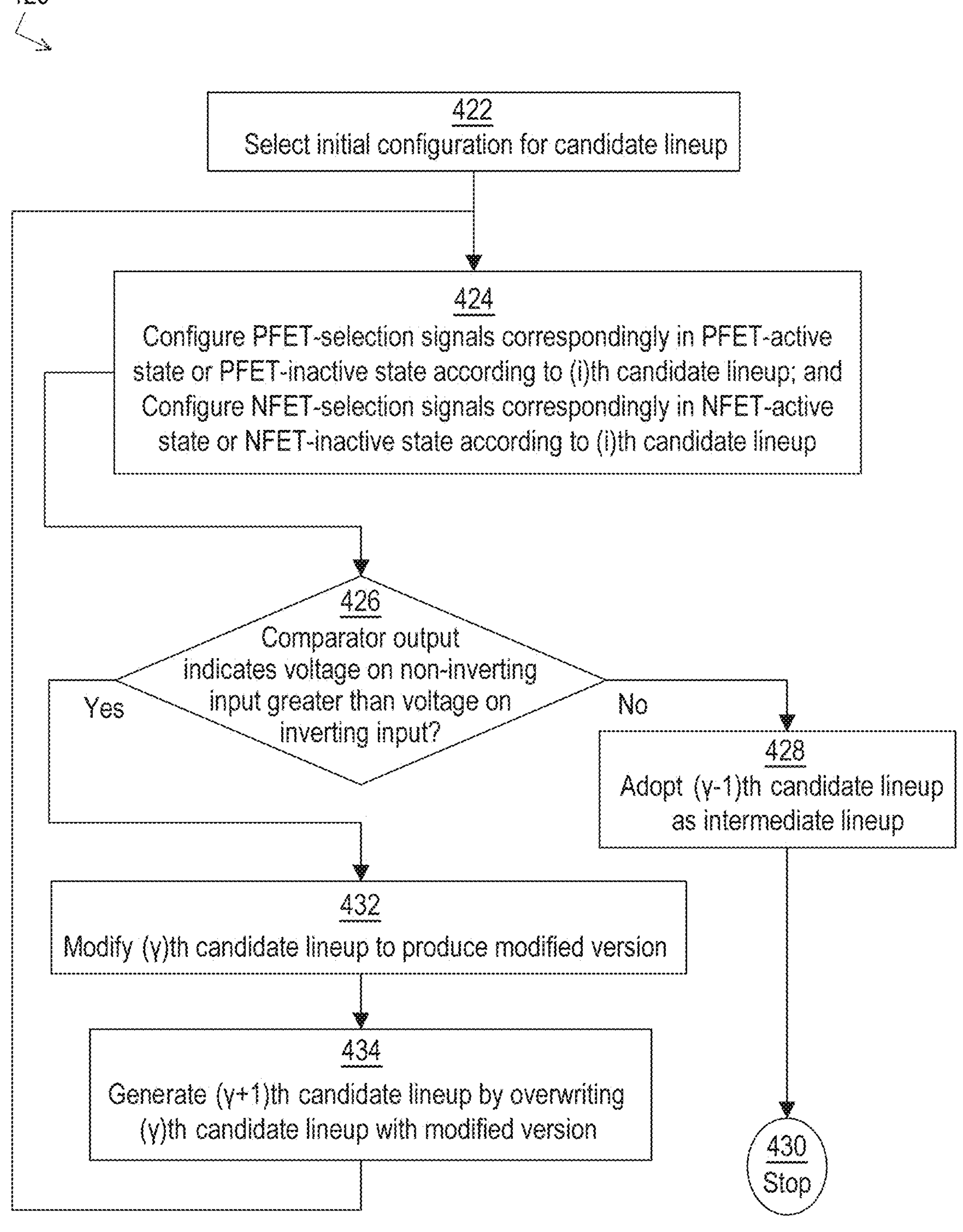

To determine the lineup for a given one of PUDI-groups 330(1)-330(5), referred to herein as group 330(*x*), operations by controller 306 are described in terms of a method 404 of flowchart 4A and a method 420 of FIG. 4B.

The lineups generated by PUDI-based CTLE 304 represent not only represent group-level precision (granularity) because the lineups are PUDI-group specific. Moreover, the lineups generated by PUDI-based CTLE 304 represent PUDI-level precision (granularity) because the lineups facilitate the generation of intra-group-PUDI-specific PFET-selection signals and intra-group-PUDI-specific NFET selection signals. As a result, lineup setter 304 achieves more precise (more granular) control and thus better performance (in terms of lessening the impact of PVTA variations) as compared to the CTLE-level precision (granularity) provided according to the other systemic approach. The counterpart PVTA-compensator attempts to adjust VSS by using a high speed VSS-manager circuit that includes a high frequency ring oscillator. The high frequency of the VSS-manager circuit according to the other systemic approach: occupies a larger area (has a large footprint); and suffers high oscillation-dependent current consumption. Also by contrast, Lineup setter 304 is not oscillator-based and thus: occupies a substantially smaller area (has a substantially smaller footprint) as compared to the counterpart PVTA-compensator according to the other systemic approach; and suffers substantially lower oscillation-dependent current consumption as compared to the counterpart PVTA-compensator according to the other systemic approach.

FIG. 4A is a flowchart of method 404, in accordance with some embodiments.

Method 404 is an example of a method by which controller 306 of FIG. 3A operates to determine the lineup for PUDI-group 330(*x*) (discussed above). Method 404 includes blocks 406-414. Flow according to method 404 begins at block 406.

At block 406, the alpha mode (discussed above) is invoked for DPDT 324A. From block 406, flow proceeds to block 408.

At block 408, while DPDT 324A is in the alpha mode, an alpha lineup (α-lineup) for group 330(*x*) is determined. The α-lineup is an intermediate line-up. The determination of the α-lineup for group 330(*x*), i.e., block 408, is an iterative process. Block 408 is discussed in more detail below in the context of FIG. 4B. From block 408, flow proceeds to block 410.

At block 410, the beta mode (discussed above) is invoked for DPDT 324A. From block 410, flow proceeds to block 412.

At block 412, while DPDT 324A is in the beta mode, a beta lineup (β-lineup) for group 330(*x*) is determined. The β-lineup is an intermediate line-up. The determination of the β-lineup for group 330(*x*), i.e., block 412, is an iterative process similar to the determination of the α-lineup for group 330(*x*). Block 412 is discussed in more detail below in the context of FIG. 4B. From block 412, flow proceeds to block 414.

At block 414, a final lineup for group 330(*x*) is determined based on the α-lineup and the β-lineup. Typically, there will be agreement such that the α-lineup and the β-lineup will be the same. However, under some circumstances, there will be disagreement such that the α-lineup will be different the β-lineup. In some embodiments, where there is disagreement, the intermediate lineup which includes a greater number of slave PFETs and slave NFETs is adopted as the final lineup for group 330(*x*). In such embodiments, if the α-lineup includes a greater number of slave PFETs and slave NFETs than are included in the β-lineup, then the α-lineup is adopted as the final lineup for group 330(*x*). If the β-lineup includes a greater number of slave PFETs and slave NFETs than are included in the α-lineup, then the ß-lineup is adopted as the final lineup for group 330(*x*).

FIG. 4B is a flowchart of method 420, in accordance with some embodiments.

Method 420 is an example of a method by which controller 306 of FIG. 3A operates to determine an intermediate lineup for PUDI-group 330(*x*) (discussed above). As such, method 420 is an example of blocks 408 or 412 of FIG. 4A, or the like. Method 420 is used in each of the alpha mode and the beta mode. In the alpha mode (discussed above), the intermediate lineup determined by method 420 is the α-lineup, or the like. In the beta mode (discussed above), the intermediate lineup determined by method 420 is the β-lineup, or the like.

Method 420 includes blocks 422-434. Flow according to method 420 begins at block 422.

At block 422, an initial configuration for a candidate lineup are selected. An example of initial configuration for a candidate lineup is discussed below.

Method 420 typically iterates through a sequence as follows block 424→block 426→block 432→block 434, as discussed below. Upon departing block 422, method 420 begins the first iteration such that the iteration count, γ, is γ=1, where γ is a positive integer. From block 422, flow proceeds to block 424.

At block 424, selection signals are configured according to the candidate lineup. More particularly, PFET-selection signals ENP330(*x*){0, . . . , Φ−1} are configured correspondingly to be in the PFET-active state or the PFET-inactive state according to the candidate lineup, and NFET-selection signals ENN330(*x*){0, . . . , Φ−1} are configured correspondingly to be in the NFET-active state or the NFET-inactive state according to the candidate lineup. An example of selection signal configuration is discussed in the context of FIG. 4C. From block 424, flow proceeds to block 426.

At block 426, which is a decision block, it is determined whether comparator 332 indicates that the voltage on its non-inverting input is equal to or greater than the voltage on its inverting input, i.e., if the output of comparator 332 represents a logical high (logical one). In the alpha mode (discussed above), the output of MUX 340 and VREF correspondingly are on the non-inverting and inverting inputs of comparator 332. In the beta mode (discussed above), VREF and the output of MUX 340 correspondingly are on the non-inverting and inverting inputs of comparator 332.

If the decision at block 426 is no, then flow proceeds to block 428. However, if the decision at block 426 is yes, then flow proceeds to block 432.

In other words, if it is determined at block 426 that the voltage on the non-inverting input actually is less than the voltage on the inverting input such that the output of comparator 332 actually represents a logical low (logical zero), then flow proceeds to block 428. However, if it is determined at block 426 that the voltage on the non-inverting input actually is greater than the voltage on the inverting input such that the output of comparator 332 actually represents a logical high (logical one), then flow proceeds to block 432.

At block 428, the intermediate lineup is set/established. However, the current candidate lineup, i.e., the (γ)th candidate lineup is not used for the intermediate lineup. Rather, the (γ−1)th candidate lineup is adopted as the intermediate lineup. In the alpha mode (discussed above), the intermediate lineup being determined is the α-lineup. In the beta mode (discussed above), the intermediate lineup being determined is the β-lineup. From block 428, flow proceeds to block 430, where flow stops.

At block 432, the candidate lineup is modified to produce a modified version of the same. In The candidate lineup is modified in a manner that will reduce the output of PUDI-group 330(*x*), i.e., that will make the voltage received on the non-inverting input of comparator 332 be less than the voltage received on the inverting input of comparator 332. From block 432, flow proceeds to block 434.

At block 434, the (γ+1)th candidate lineup is generated by overwriting the (γ)th candidate lineup with the modified version. From block 434, flow loops back to block 424 resulting in another iteration of blocks 424-426.

In some embodiments, the iterative process of FIG. 4B is informed by an assumption that iterations progress from smaller to larger candidate lineups. A candidate lineup is represented as 330(*x*)(Σ_PFET, Σ_NFET), where Σ_PFET represents the count of slave PFETs that are enabled for operation, and where Σ_NFET represents the count of slave PFETs that are enabled for operation. In some embodiments, each PUDI-group is an instance of PUDI(i) 108 of FIG. 1B such that, subject to PVTA-variations: all instances of master P11 are the substantially the same; all instances of slave P11 are the substantially the same; all instances of slave N11 are the substantially the same; and all instances of master N12 are the substantially the same. In some embodiments, it is further assumed that the current-driving/sourcing capability/capacity of slave P12 is smaller than that of slave N12. In some embodiments, the iterative process of FIG. 4B is informed by one or more assumptions other than that iterations progress from smaller to larger candidate lineups.

In some embodiments, under the assumption that iterations progress from smaller to larger candidate lineups, the candidate lineup is modified at block 432 as follows. A determination is made: does Σ_PFET=ΣNFET? If so, then Σ_PFET is incremented such that Σ_PFET=Σ_PFET+1 resulting in the modified version of the candidate lineup, mod_330(*x*)(Σ_PFET, Σ_NFET), being as follows: mod_330(*x*)(Σ_PFET, Σ_NFET)=330(*x*)(Σ_PFET+1, Σ_NFET). If not, i.e., if Σ_PFET≠Σ_NFET, then Σ_NFET is incremented such that Σ_NFET=Σ_NFET+1 resulting in the modified version of the candidate lineup being as follows: mod_330(*x*)(Σ_PFET, Σ_NFET)=330(*x*)(Σ_PFET, Σ_NFET+1). In such embodiments, because of the assumptions that (1) iterations progress from smaller to larger candidate lineups and (2) the current-driving/sourcing capability/capacity of slave P12 is smaller than that of slave N12, no candidate lineup is used for which Σ_PFET<Σ_NFET. Hence, in such embodiments, the circumstance that Σ_PFET≠Σ_NFET implies that Σ_NFET<Σ_PFET.

In some embodiments, under the assumption that iterations progress from smaller to larger candidate lineups, the initial configuration for candidate lineup is set to 330(*x*)(Σ_PFET=1, Σ_NFET=0) at block 422. Though 330(*x*)(Σ_PFET=0, Σ_NFET=0) is the smallest possible candidate lineup, the output of group 330(*x*) for Σ_PFET=0 and Σ_NFET=0 will be substantially zero and thus always smaller than VREF, resulting in an unnecessary iteration. Accordingly, typically 300(*x*)(Σ_PFET=0, Σ_NFET=0) is excluded from being used as initial values at block 422.

In some embodiments, the iterative process of FIG. 4B is informed by an assumption that iterations progress from larger to smaller candidate lineups. In such embodiments, the initial configuration for candidate lineup is set to 330(*x*)(Σ_PFET>1, ENFET>1) at block 422. In some embodiments, a positive integer, minimum value, min_P, is placed on Σ_PFET such that 0<min_P≤Σ_PFET. In some embodiments, the minimum value min_P is referred to as a PFET guard band. In some embodiments, a positive integer, minimum value, min_N, is placed on Σ_NFET such that 0<min_N≤Σ_NFET. In some embodiments, the minimum value min_N is referred to as an NFET guard band. In some embodiments, it is further assumed that the current-driving/sourcing capability/capacity of slave P12 is smaller than that of slave N12 such that Σ_NFET<Σ_PFET (see discussion above). In some circumstances, in which the (γ)th candidate lineup is 330(*x*)(Σ_PFET>1, Σ_NFET=min_N) such that the (γ+1)th candidate lineup otherwise impermissibly would become 330(*x*)(Σ_PFET>1, Σ_NFET=(min_N−1)) at block 432, then the ($\gamma$)th candidate lineup of 330(*x*)(Σ_PFET>1, Σ_NFET=min_N) is adopted as the intermediate lineup and flow proceeds to block 430 instead of proceeding to block 434.

In some embodiments, the number of possible candidate lineups, $\sigma$, is $\sigma=(\Phi2)$. Where method 420 is applied to group 330(5), i.e., group 330(5) is treated as group 330**(*x*), then $\Phi$=p. Similarly, where method 420 is applied to groups 330(1)-330(4), then correspondingly $\Phi$=j, $\Phi$=k, $\Phi$=q and $\Phi$=n. Similarly, where method 420 is applied to groups 330(1)-330(4), =p.

FIG. 4C is a Table 437, in accordance with some embodiments.

Table 437 is an example of how iterations of method 420 of FIG. 4B progress from smaller to larger candidate lineups, in accordance with some embodiments. Table 37 assumes a context in which method 420 is applied to PUDI-group 330(5) of FIG. 3A. PUDI-group 330(5) includes 5 PUDIs, hence group 330(5) includes 5 instances of slave PFET P12 and 5 instances of slave NFET N11. FIG. 4B assumes that method 420 undergoes six out of a possible eight iterations.

Regarding the example of Table 437, in the fifth iteration of method 420, i.e., for iteration count $\gamma$=5, the candidate lineup is 300(5)(Σ_PFET=3, Σ_NFET=2). At block 426, it is determined that the output of comparator 332 represents a logical high (logical one), i.e., that the voltage on the non-inverting input of comparator 332 is equal to or greater than the voltage on the inverting input thereof. Accordingly, flow proceeds along the YES exit/path from decision block 426 to block 432.

Regarding the example of Table 437, at block 432, the current candidate lineup, i.e., 300(5)(Σ_PFET=3, Σ_NFET=2), is modified to be mod_300(5)(Σ_PFET=3, Σ_NFET=2)=300(5)(Σ_PFET=3, Σ_NFET=2+1). From block 423, flow proceeds to block 434. At block 434, the next candidate lineup, i.e., the ($\gamma$+1)th candidate lineup, is generated by overwriting the ($\gamma$)th candidate lineup with the modified version such that the candidate lineup for the sixth iteration ($\gamma$=6) will be 300(5)(Σ_PFET=3, Σ_NFET=3). From block 434, flow loops back to block 424 to begin the sixth iteration ($\gamma$=6).

Regarding the example of Table 437, in the sixth ($\gamma$=6) iteration of method 420, the candidate lineup is 300(5)(Σ_PFET=3, Σ_NFET=3). When flow reaches decision block 426, it is determined that the output of comparator 332 represents a logical low (logical zero), i.e., that the voltage on the non-inverting input of comparator 332 is less than the voltage on the inverting input thereof. Accordingly, flow proceeds along on the 'NO' exit/path from decision block 426 to block 428.

Regarding the example of Table 437, in the sixth ($\gamma$=6) iteration of method 420, the intermediate lineup is set/established at block 428. However, the current candidate lineup, i.e., the ($\gamma$=6)th candidate lineup is not used for the intermediate lineup. Rather, the ($\gamma$−1=5)th candidate lineup is adopted such that the intermediate lineup is set to be 300(5)(Σ_PFET=3, Σ_NFET=2). From block 428, flow proceeds to block 430, where flow stops. Accordingly, for the example of Table 437, seventh and eighth iterations of method 420 are not performed.

Figure 5:
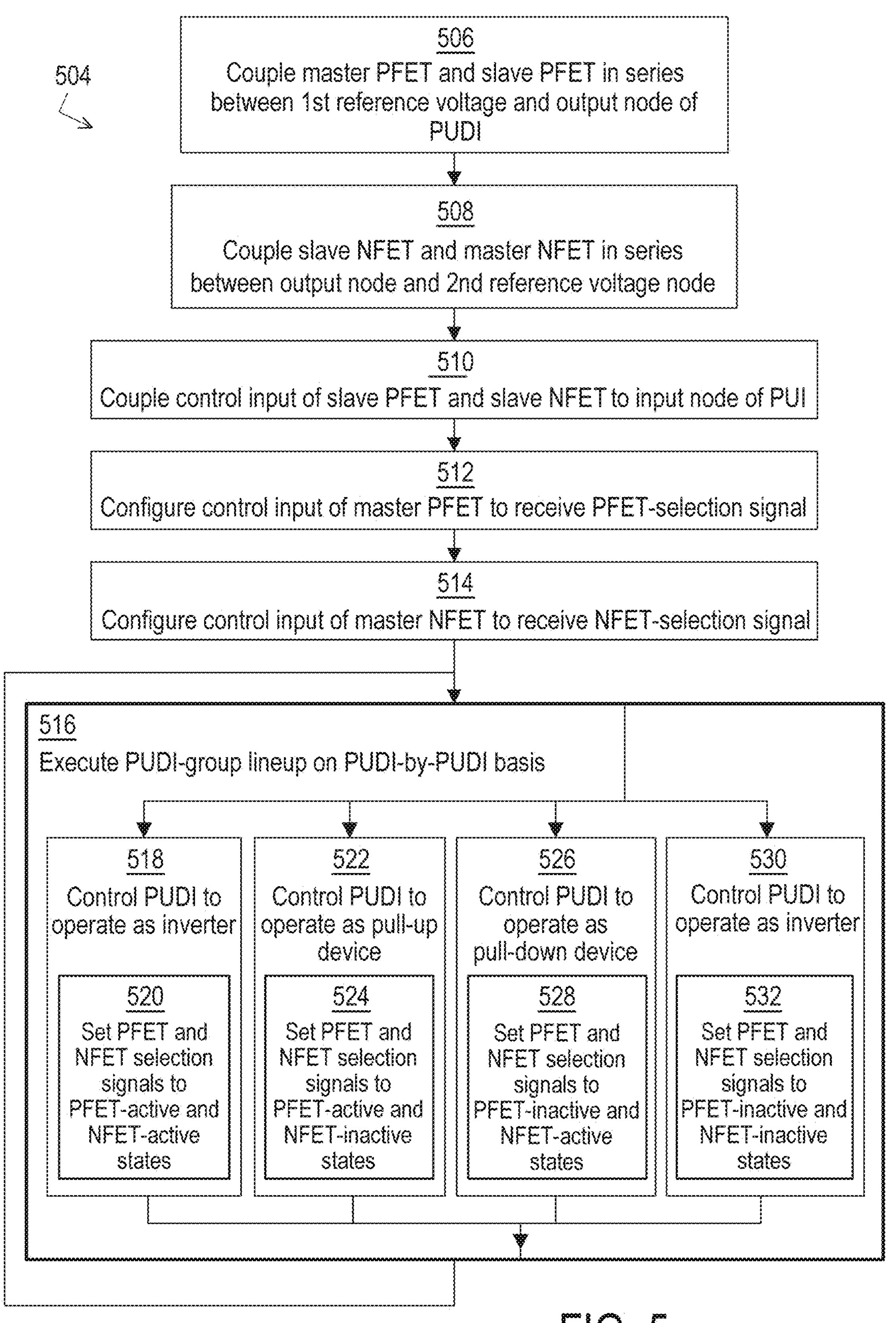
FIGS. 5-7 are flowcharts of corresponding methods, in accordance with some embodiments.

FIG. 5 is a flowchart of a method 504 of operating a PUDI, in accordance with some embodiments.

An example of a PUDI operated according to method 504 is PUDI(i) 108 of FIG. 1B, or the like.

Method 504 includes blocks 504-532. At block 506, a master PFET and a slave PFET are coupled in parallel between a first reference voltage and an output node of the PUDI. An example of the master PFET is master P11 of FIG. 1B, or the like. An example of the slave PFET is slave P12 of FIG. 1B, or the like. An example of the first reference voltage is VDD, or the like. An example of the output node of the PUDI is output node OUT of FIG. 1B, or the like. From block 506, flow proceeds to block 508.

At block 508, a slave NFET and a master NFET are coupled in parallel between the output node and a second reference voltage. An example of the slave NFET is slave N11 of FIG. 1B, or the like. An example of the master NFET is master N12 of FIG. 1B, or the like. An example of the second reference voltage is VSS, or the like. From block 508, flow proceeds to block 510.

At block 510, a control input of each of the slave PFET and the slave NFET is coupled to an input node of the PUDI. An example of the input node of the PUDI is input node IN of FIG. 1B, or the like. From block 510, flow proceeds to block 512.

At block 512, a control input of the master PFET is configured to receive a PFET-selection signal. An example of the control input of the master PFET is the gate terminal of master P11 of FIG. 1B, or the like. An example of the PFET-selection signal is signal ENP(i) of FIG. 1B, or the like. From block 512, flow proceeds to block 514.

At block 514, a control input of the master NFET is configured to receive an NFET-selection signal. An example of the control input of the master NFET is the gate terminal of master N12 of FIG. 1B, or the like. An example of the NFET-selection signal is signal ENN(i) of FIG. 1B, or the like. From block 514, flow proceeds to block 516.

At block 516, the PUDI-group lineup is executed including the lineup for PUDI(i) of the PUDI-group. An example of a PUDI-group lineup is 300(5)(Σ_PFET=3, Σ_NFET=2), as discussed in the context of the example of FIG. 4C, or the like.

Block 516 includes blocks 518, 522, 524 and 530. Flow proceeds within block 516 to one of blocks 518, 522, 524 and 530 according to the lineup for PUD(i). From each of blocks 518, 522, 524 and 530, flow exits block 516 and proceeds to loop back to the entry of block 516. In some embodiments, such looping through block 516 is responsive to a change in the lineup, e.g., as signaled to the corresponding PUDI-based CTLE system (e.g., 102 FIG. 1A) by the corresponding lineup setter (e.g., 102 FIG. 1A).

At block 518, PUDI(i) is controlled to operate as an inverter. Block 518 includes block 520. At block 520, the PFET-selection for the master PFET and the NFET-selection signal for the master NFET correspondingly are set to be in the PFET-active state and the NFET-active state. Flow proceeds from block 520 to exit from block 516.

At block 522, PUDI(i) is controlled to operate as a pull-up device. Block 522 includes block 524. At block 524, the PFET-selection for the master PFET and the NFET-selection signal for the master NFET correspondingly are set to be in the PFET-active state and the NFET-inactive state. Flow proceeds from block 522 to exit from block 516.

At block 526, PUDI(i) is controlled to operate as a pull-down device. Block 526 includes block 528. At block 528, the PFET-selection for the master PFET and the NFET-selection signal for the master NFET correspondingly are set to be in the PFET-inactive state and the NFET-active state. Flow proceeds from block 528 to exit from block 516.

At block 530, PUDI(i) is controlled to represent a high impedance state. Block 530 includes block 532. At block 532, the PFET-selection for the master PFET and the NFET-selection signal for the master NFET correspondingly are set to be in the PFET-inactive state and the NFET-inactive state. Flow proceeds from block 532 to exit from block 516.

The flowchart of FIG. 5 shows a sequence for blocks 506-512 as follows: block 506→block 508→block 510→block 512→block 514. In some embodiments, blocks 506-514 have sequences other than the noted sequence.

Figure 6:
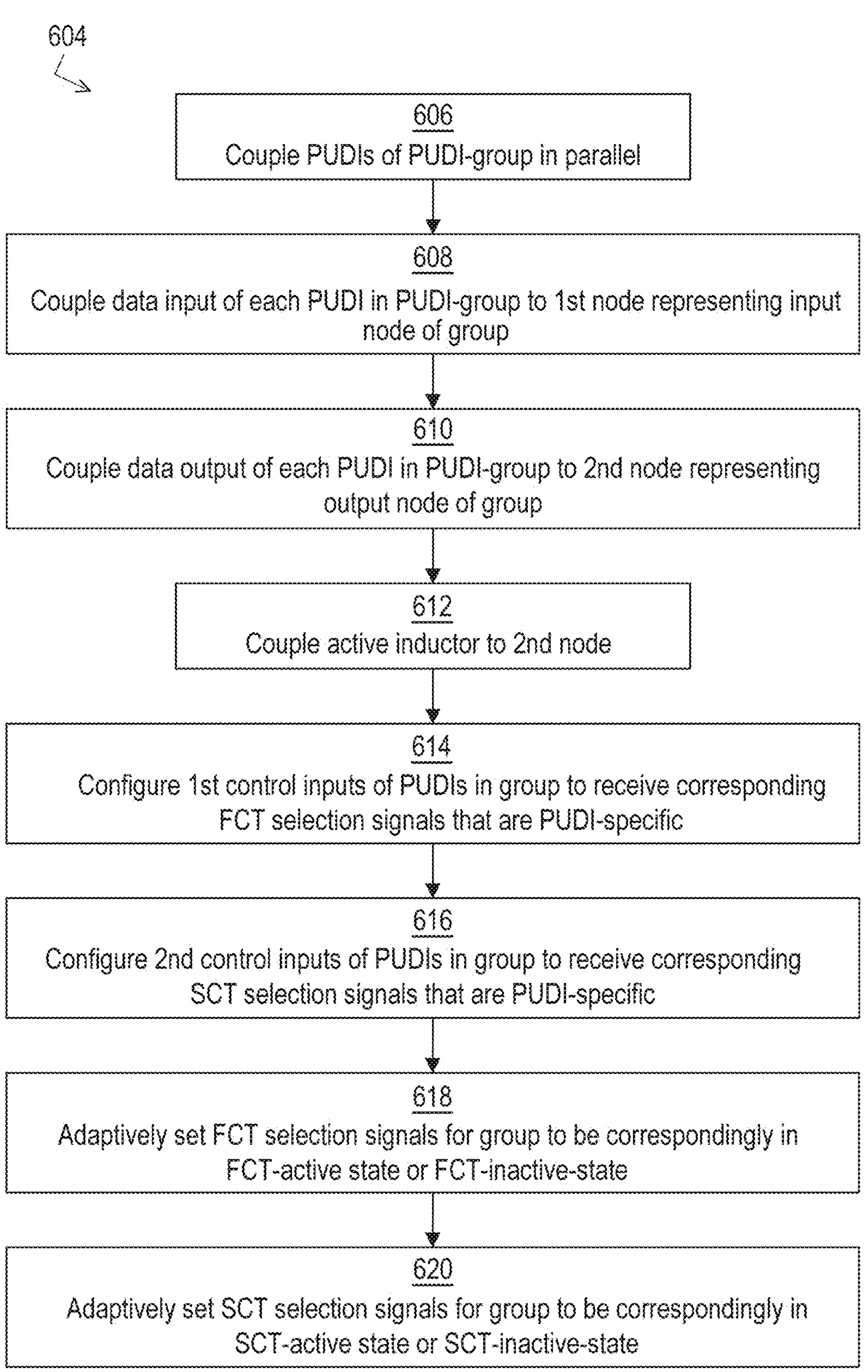

FIG. 6 is a flowchart of a method 604 of operating a PUDI-based CTLE, in accordance with some embodiments.

An example of the PUDI-based CTLE operated according to method 504 is CTLE 102 of FIG. 1A, CTLE 202 of FIG. 2, or the like. Method 604 includes blocks 606-620. At block 606, the PUDIs of a group of PUDIs (PUDI-group) are coupled to each other in parallel. An example of the PUDIs is PUDI(i) 108 of FIG. 1A, or the like. An example of the PUDI-group is PUDI-group 230(1) of FIG. 2, or the like. From block 606, flow proceeds to block 608.

At block 608, the data input of each PUDI in the PUDI-group is coupled to a first node that represents an input of the PUDI-group. An example the data input of the PUDI is input node IN of PUDI(i) 108 of FIG. 1B, or the like. An example of the first node is node nd11 of FIG. 2, or the like. From block 608, flow proceeds to block 610.

At block 610, the data output of each PUDI in the PUDI-group is coupled to a second node that represents an output of the PUDI-group. An example the data output of the PUDI is output node OUT of PUDI(i) 108 of FIG. 1B, or the like. An example of the second node is node nd12 of FIG. 2, or the like. From block 610, flow proceeds to block 612.

At block 612, an active inductor is coupled to the second node. An example of the active inductor is active inductor 236(1) of FIG. 2, or the like. An example of an It is to be recalled that active inductor 236(1) active inductor includes PUDI-group 230(11) coupled in parallel to resistor 238(11). From block 612, flow proceeds to block 614.

At block 614, the first control inputs of the PUDIs in the PUDI-group are configured to receive corresponding first conductivity type (FCT) selection signals that are PUDI-specific. Relative to the example of a PUDI provided in the context of block, e.g., 606, PUDI(i) 108 which includes master PFET P11 and master NFET N11, an example of a first conductivity type is P-type such that an example of the FCT selection signals is PFET selection signal ENP(i), or the like. From block 614, flow proceeds to block 616.

At block 616, the second control inputs of the PUDIs in the PUDI-group are configured to receive corresponding second conductivity type (SCT) selection signals that are PUDI-specific. Relative to the example of a PUDI provided in the context of block, e.g., 606, PUDI(i) 108 which includes master PFET P11 and master NFET N11, an example of a second conductivity type is N-type such that an example of the SCT selection signals is NFET selection signal ENN(i), or the like. From block 616, flow proceeds to block 618.

At block 618, the FCT selection signals for the group are set to be correspondingly in an FCT-active state or an FCT-inactive state. Examples of FCT-active and FCT-inactive states of an FCT selection signal correspondingly are the PFET-active state and the PFET-inactive state of signal ENP(i) of FIG. 1B, or the like. From block 618, flow proceeds to block 620.

At block 620, the SCT selection signals for the group are set to be correspondingly in an SCT-active state or an SCT-inactive state. Examples of SCT-active and SCT-inactive states of an SCT selection signal correspondingly are NFET-active state and NFET-inactive state of signal ENN(i) of FIG. 1B, or the like.

In FIG. 6, method 604 shows a sequence for blocks 606-616 as follows: block 606→block 608→block 610→block 612→block 614→block 616. In some embodiments, blocks 606-616 have sequences other than the noted sequence.

In FIG. 6, method 604 shows a sequence for blocks 618-620 as follows: block 618→block 620. In some embodiments, blocks 618-620 as having the opposite sequence, namely block 620→block 618.

Figure 7:
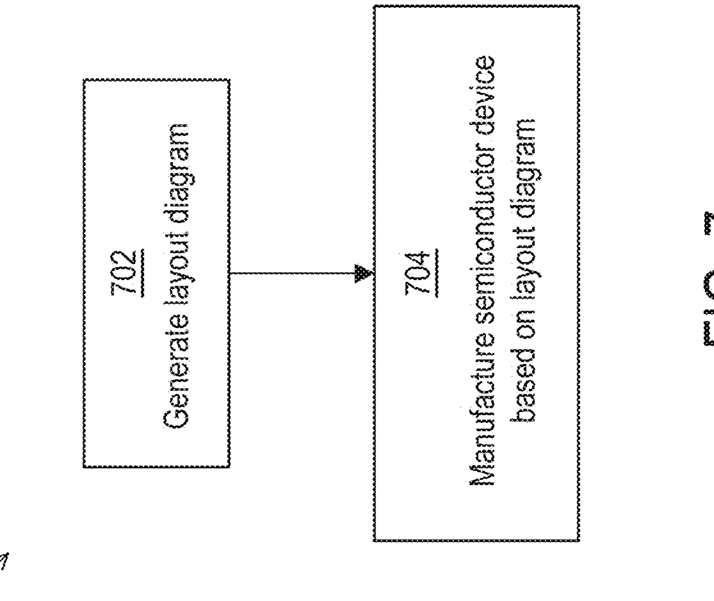

FIG. 7 is a flowchart (flow diagram) of a method 700 of manufacturing a system or device, in accordance with some embodiments.

Method 700 is implementable, for example, using EDA system 800 (FIG. 8, discussed below) and an IC manufacturing system 900 (FIG. 9, discussed below), in accordance with some embodiments. Examples of a system or device which can be manufactured according to method 700 include the systems or devices disclosed herein, or the like.

In FIG. 7, the method of flowchart 700 includes blocks 702-704. At block 702, a layout diagram is generated which, among other things, includes one or more layout diagrams corresponding to one or more of the systems or devices disclosed herein, or the like. Block 702 is implementable, for example, using EDA system 800 (FIG. 8, discussed below), in accordance with some embodiments. From block 702, flow proceeds to block 704.

At block 704, based on the layout diagram, at least one of (A) one or more photolithographic exposures are made or (b) one or more photolithography masks are fabricated or (C) one or more components in a layer of a device, e.g., a device is fabricated. Sec discussion below of IC manufacturing system 900 in FIG. 9 below.

Figure 8:
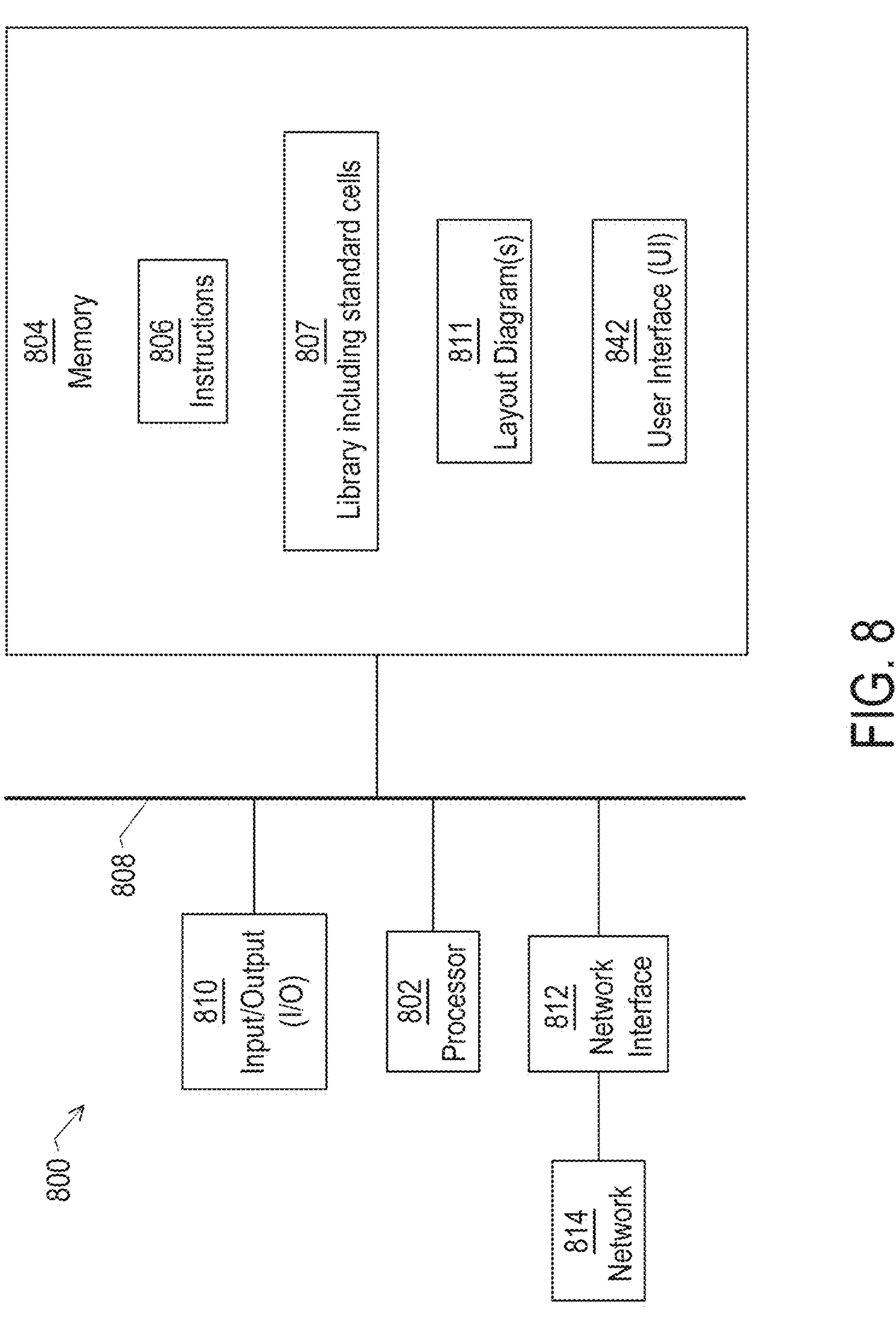
FIG. 8 is a block diagram of an electronic design automation (EDA) system in accordance with some embodiments.

FIG. 8 is a block diagram of an electronic design automation (EDA) system 800 in accordance with some embodiments.

In some embodiments, EDA system 800 includes an automatic placement and routing (APR) system. In some embodiments, EDA system 800 is a general purpose computing device including a hardware processor 802 and a non-transitory, computer-readable storage medium 804. Storage medium 804, amongst other things, is encoded with, i.e., stores, computer program code 806, i.e., a set of executable instructions. Execution of instructions 806 by hardware processor 802 represents (at least in part) an EDA tool which implements a portion or all of, e.g., methods such as the methods disclosed herein of generating layout diagrams, methods of generating layout diagrams such as the layout diagrams disclosed herein or layout diagrams corresponding to the devices disclosed herein, or the like, in accordance with one or more embodiments (hereinafter, the noted processes and/or methods).

Storage medium 804, amongst other things, stores layout diagrams 811 such as the layout diagrams disclosed herein, other the like.

Processor 802 is electrically coupled to computer-readable storage medium 804 via a bus 808. Processor 802 is further electrically coupled to an I/O interface 810 by a bus 808. A network interface 812 is further electrically connected to processor 802 via bus 808. Network interface 812 is connected to a network 814, so that processor 802 and computer-readable storage medium 804 are capable of connecting to external elements via network 814. Processor 802 is configured to execute computer program code 806 encoded in computer-readable storage medium 804 in order to cause EDA system 800 to be usable for performing a portion or all of the noted processes and/or methods. In one or more embodiments, processor 802 is a central processing unit (CPU), a multi-processor, a distributed processing system, an application specific integrated circuit (ASIC), and/or a suitable processing unit.

In one or more embodiments, computer-readable storage medium 804 is an electronic, magnetic, optical, electromagnetic, infrared, and/or a semiconductor system (or apparatus or device). For example, computer-readable storage medium 804 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 804 includes a compact disk-read only memory (CD-ROM), a compact disk-read/write (CD-R/W), and/or a digital video disc (DVD).

In one or more embodiments, storage medium 804 stores computer program code 806 configured to cause EDA system 800 (where such execution represents (at least in part) the EDA tool) to be usable for performing a portion or all of the noted processes and/or methods. In one or more embodiments, storage medium 804 further stores information which facilitates performing a portion or all of the noted processes and/or methods. In one or more embodiments, storage medium 804 stores library 807 of standard cells including such standard cells as disclosed herein. In some embodiments, storage medium 804 stores one or more layout diagrams 811.

EDA system 800 includes I/O interface 810. I/O interface 810 is coupled to external circuitry. In one or more embodiments, I/O interface 810 includes a keyboard, keypad, mouse, trackball, trackpad, touchscreen, and/or cursor direction keys for communicating information and commands to processor 802.

EDA system 800 further includes network interface 812 coupled to processor 802. Network interface 812 allows EDA system 800 to communicate with network 814, to which one or more other computer systems are connected. Network interface 812 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more EDA systems 800.

EDA system 800 is configured to receive information through I/O interface 810. The information received through I/O interface 810 includes one or more of instructions, data, design rules, libraries of standard cells, and/or other parameters for processing by processor 802. The information is transferred to processor 802 via bus 808. EDA system 800 is configured to receive information related to a user interface (UI) through I/O interface 810. The information is stored in computer-readable medium 804 as UI 842.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 800. In some embodiments, a layout which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 9:
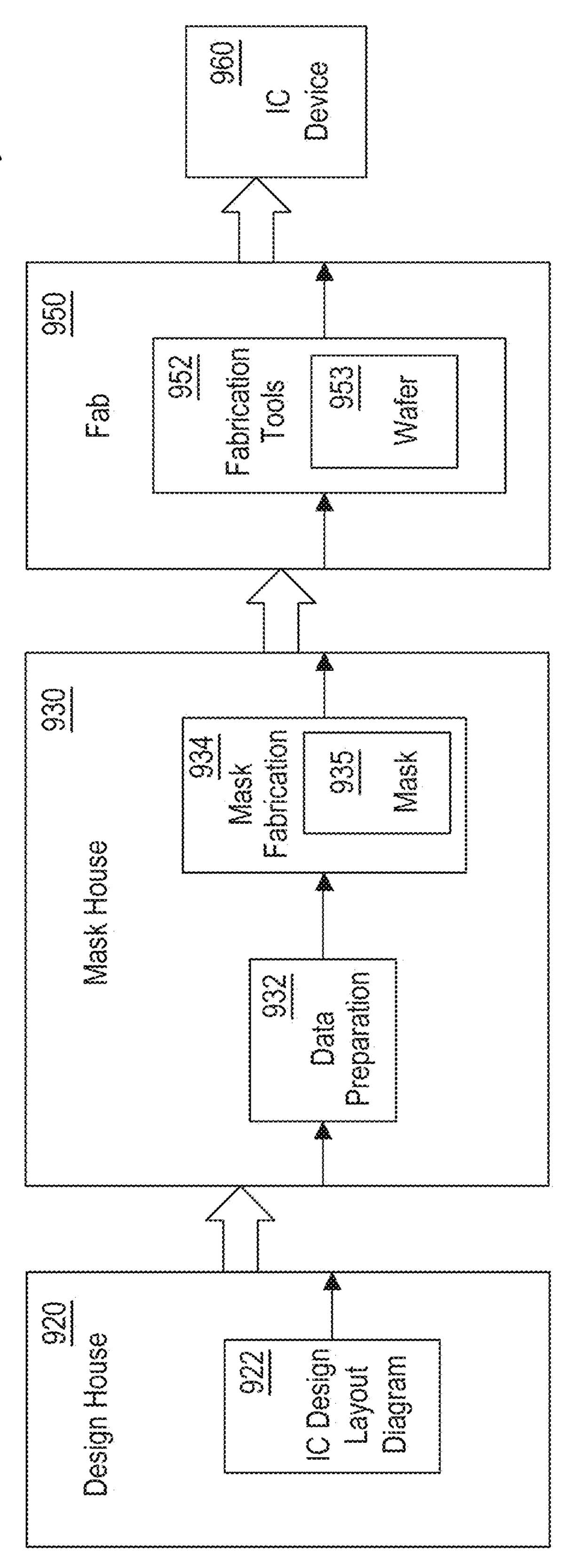
FIG. 9 is a block diagram of an integrated circuit (IC) manufacturing system, and an IC manufacturing flow associated therewith, in accordance with some embodiments.

FIG. 9 is a block diagram of an integrated circuit (IC) manufacturing system 900, and an IC manufacturing flow associated therewith, in accordance with some embodiments.

In some embodiments, based on the layout diagram generated by block 602 of FIG. 6, the IC manufacturing system 900 implements block 704 of FIG. 7 wherein at least one of (A) one or more semiconductor masks or (B) at least one component in a layer of an inchoate semiconductor integrated circuit is fabricated using manufacturing system 900. In some embodiments, the IC manufacturing system 900 implements the flowcharts of FIGS. 7A-7B.

In FIG. 9, IC manufacturing system 900 includes entities, such as a design house 920, a mask house 930, and an IC manufacturer/fabricator ("fab") 950, that interact with one another in the design, development, and manufacturing cycles and/or services related to manufacturing an IC device 960. The entities in system 900 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and supplies services to and/or receives services from one or more of the other entities. In some embodiments, two or more of design house 920, mask house 930, and IC fab 950 is owned by a single larger company. In some embodiments, two or more of design house 920, mask house 930, and IC fab 950 coexist in a common facility and use common resources.

Design house (or design team) 920 generates an IC design layout 922. IC design layout 922 includes various geometrical patterns designed for an IC device 960. The geometrical patterns correspond to patterns of metal, oxide, or semiconductor layers that make up the various components of IC device 960 to be fabricated. The various layers combine to form various IC features. For example, a portion of IC design layout 922 includes various IC features, such as an active region, gate terminal, source and drain, metal lines or vias of an interlayer interconnection, and openings for bonding pads, to be formed in a semiconductor substrate (such as a silicon wafer) and various material layers disposed on the semiconductor substrate. Source/drain region(s) may refer to a source or a drain, individually or collectively, dependent upon the context. Design house 920 implements a proper design procedure to form IC design layout 922. The design procedure includes one or more of logic design, physical design or place and route. IC design layout 922 is presented in one or more data files having information of the geometrical patterns. For example, IC design layout 922 is expressed in a GDSII file format or DFII file format.

Mask house 930 includes data preparation 932 and mask fabrication 934. Mask house 930 uses IC design layout 922 to manufacture one or more masks 935 to be used for fabricating the various layers of IC device 960 according to IC design layout 922. Mask house 930 performs mask data preparation 932, where IC design layout 922 is translated into a representative data file ("RDF"). Mask data preparation 932 supplies the RDF to mask fabrication 934. Mask fabrication 934 includes a mask writer. A mask writer converts the RDF to an image on a substrate, such as a mask (reticle) or a semiconductor wafer. The design layout is manipulated by mask data preparation 932 to comply with particular characteristics of the mask writer and/or requirements of IC fab 950. In FIG. 9, mask data preparation 932, mask fabrication 934, and mask 935 are illustrated as separate elements. In some embodiments, mask data preparation 932 and mask fabrication 934 are collectively referred to as mask data preparation.

In some embodiments, mask data preparation 932 includes optical proximity correction (OPC) which uses lithography enhancement techniques to compensate for image errors, such as those that can arise from diffraction, interference, other process effects and the like. OPC adjusts IC design layout 922. In some embodiments, mask data preparation 932 includes further resolution enhancement techniques (RET), such as off-axis illumination, sub-resolution adjust features, phase-shifting masks, other suitable techniques, and the like or combinations thereof. In some embodiments, inverse lithography technology (ILT) is further used, which treats OPC as an inverse imaging problem.

In some embodiments, mask data preparation 932 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during mask fabrication 934, which may undo part of the modifications performed by OPC in order to meet mask creation rules.

In some embodiments, mask data preparation 932 includes lithography process checking (LPC) that simulates processing that will be implemented by IC fab 950 to fabricate IC device 960. LPC simulates this processing based on IC design layout 922 to fabricate a simulated manufactured device, such as IC device 960. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been fabricated by LPC, if the simulated device is not close enough in shape to satisfy design rules, OPC and/or MRC are be repeated to further refine IC design layout 922.

The above description of mask data preparation 932 has been simplified for the purposes of clarity. In some embodiments, mask data preparation 932 includes additional features such as a logic operation (LOP) to modify the IC design layout according to manufacturing rules. Additionally, the processes applied to IC design layout 922 during data preparation 932 may be executed in a variety of different orders.

After mask data preparation 932 and during mask fabrication 934, a mask 935 or a group of masks 935 are fabricated based on the modified IC design layout. In some embodiments, an electron-beam (e-beam) or a mechanism of multiple e-beams is used to form a pattern on a mask (photomask or reticle) based on the modified IC design layout. The masks are formed in various technologies. In some embodiments, the mask is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask is an attenuated PSM or alternating PSM. The mask(s) generated by mask fabrication 934 is used in a variety of processes. For example, such a mask(s) is used in an ion implantation process to form various doped regions in the semiconductor wafer, in an etching process to form various etching regions in the semiconductor wafer, and/or in other suitable processes.

IC fab 950 is an IC fabrication business that includes one or more manufacturing facilities for the fabrication of a variety of different IC products. In some embodiments, IC fab 950 is a semiconductor foundry. For example, there may be a manufacturing facility for the front end fabrication of a plurality of IC products (front-end-of-line (FEOL) fabrication), while a second manufacturing facility may supply the back end fabrication for the interconnection and packaging of the IC products (back-end-of-line (BEOL) fabrication), and a third manufacturing facility may supply other services for the foundry business.

IC fab 950 uses mask (or masks) 935 fabricated by mask house 930 to fabricate IC device 960 using fabrication tools 952. Thus, IC fab 950 at least indirectly uses IC design layout 922 to fabricate IC device 960. In some embodiments, a semiconductor wafer 953 is fabricated by IC fab 950 using mask (or masks) 935 to form IC device 960. Semiconductor wafer 953 includes a silicon substrate or other proper substrate having material layers formed thereon. Semiconductor wafer further includes one or more of various doped regions, dielectric features, multilevel interconnects, and the like (formed at subsequent manufacturing steps).

In some embodiments, a system (for determining a starting-lineup) includes: a comparator configured to make a comparison between a reference voltage and an output of a subject group; the subject group including pull-up-pull-down-inverters (PUDIs) coupled in parallel, each of the PUDIs including master and slave positive-channel metal oxide semiconductor (PMOS) field-effect transistor (FETs) (PFETs) and slave and master negative-channel metal oxide semiconductor (NMOS) FETs (NFETs); for each of the PUDIs, a control input of each of the slave PFET and slave NFET transistors being coupled to an input node of the PUDI, a control input of the master PFET transistor being configured to receive a PFET-selection signal that is PUDI-specific, and a control input of the master NFET transistor being configured to receive an NFET-selection signal that is PUDI-specific; the roster being comprised of all slave PFETs and all slave NFETs in the subject group; and for the subject group), a controller configured to perform an assessment of a candidate lineup chosen from the roster, the assessment including: set PFET-selection selection signals for the subject group to be correspondingly in an PFET-active state or a PFET-inactive state, set NFET-selection signals for the subject group to be correspondingly in an NFET-active state or an NFET-inactive state; and perform a manipulation based on the comparison including setting the starting-lineup to be the candidate lineup, or modifying the candidate lineup and repeating the assessment and manipulation.

In some embodiments, the system further includes a double-pole double-throw (DPDT) switching circuit configured to receive the reference voltage and the output of the subject group, and having first and second outputs coupled correspondingly to non-inverting and inverting inputs of the comparator, the DPDT switching circuit being further configured to operate as follows including: in a first mode, couple the first and second outputs of the DPDT switching circuit correspondingly to (A) the reference voltage and (B) the output of the subject group to according to an active state of a first mode signal; and in a second mode, couple the first and second outputs of the DPDT switching circuit correspondingly to (B) the output of the subject group and (A) the reference voltage to according to an active state of a second mode signal; and the controller is further configured to generate the first mode signal and the second mode signal.

In some embodiments, the subject group is included in a continuous-time-linear equalizer (CTLE).

In some embodiments, the DPDT switching circuit includes: a first FET coupled between a first node and the non-inverting input of the comparator, the first node being configured to receive the reference voltage; a second FET coupled between the first node and the inverting input of the comparator; a third FET coupled between a second node and the non-inverting input of the comparator, the second node being configured to receive the output of the subject group; and a fourth FET coupled between the second node and the inverting input of the comparator; a control input of each of the first and fourth FETs is configured to receive the first mode signal; and a control input of each of the second and third FETs is configured to receive the second mode signal.

In some embodiments, in the first mode, the comparator is further configured to make a first comparison yielding a first-mode result; in the second mode, the comparator is further configured to make a second comparison yielding a second-mode result; the controller is further configured to operate as follows including make a first iteration of the assessment of the candidate lineup in the first mode, make a second iteration of the assessment of the candidate lineup in the second mode, and perform the manipulation based on the first-mode result and the second-mode result.

In some embodiments, the system further includes a first group of j PUDIs coupled in parallel, a second group of k PUDIs coupled in parallel, k being a positive integer, j and k being corresponding positive integers with k<j, and a multiplexer. The multiplexer is configured to operate as follows including: receive the output of the first group and an output of the second group; and adaptively provide the output of the first group or the output of the second group as the output of the subject group to the comparator based on a choice signal. The controller is further configured to generate the choice signal.

In some embodiments, a method (of determining a starting-lineup) includes: selecting one amongst groups of pull-up-pull-down-inverters (PUDIs) to be a subject group, each of the PUDIs including master and slave positive-channel metal oxide semiconductor (PMOS) field-effect transistor (FETs) (PFETs) and slave and master negative-channel metal oxide semiconductor (NMOS) FETs (NFETs); coupling the PUDIs of the subject group in parallel; for each of the PUDIs in the subject group, coupling a control input of each of the slave PFET and slave NFET transistors to an input node of the PUDI, configuring a control input of the master PFET transistor to receive a PFET-selection signal that is PUDI-specific, and configuring a control input of the master NFET transistor to receive an NFET-selection signal that is PUDI-specific; assessing a candidate lineup for the subject group chosen from the roster, the roster being comprised of all slave PFETs and all slave NFETs in the subject group, the assessing including setting the PFET-selection signals to be correspondingly in a PFET-active state or a PFET-inactive state according to the candidate lineup, setting the NFET-selection signals to be correspondingly in an NFET-active state or an NFET-inactive state according to the candidate lineup, and using a comparator to make a comparison of a reference voltage and an output of the subject group; and performing a manipulation based on the comparison including setting the starting-lineup to be the candidate lineup, or modifying the candidate lineup and repeating the assessment and manipulation.

In some embodiments, the method further includes: generating a first mode signal corresponding to a first mode; in the first mode, coupling (A) the output of the subject group and (B) the reference voltage correspondingly to non-inverting and inverting inputs of the comparator according to an active state of the first mode signal; generating a second mode signal corresponding to a second mode; and in the second mode, coupling (B) the reference voltage and (A) the output of the subject group correspondingly to the non-inverting and inverting inputs of the comparator according to an active state of the second mode signal.

In some embodiments, the method further includes: coupling a first FET between a first node and the non-inverting input of the comparator; configuring the first node to receive the reference voltage; coupling a second FET between the first node and the inverting input of the comparator; coupling a third FET between a second node and the non-inverting input of the comparator; configuring the second node to receive the output of the subject group; coupling a fourth FET between the second node and the inverting input of the comparator; configuring a control input of each of the first and fourth FETs to receive the first mode signal; and configuring a control input of each of the second and third FETs to receive the second mode signal.

In some embodiments, the method further includes: in the first mode, controlling the comparator to make a first comparison yielding a first-mode result; in the second mode, controlling the comparator to make a second comparison yielding a second-mode result; in the first mode, making a first iteration of the assessing a candidate lineup; in the second mode, making a second iteration of the assessing a candidate lineup; and the performing the manipulation includes basing the manipulation on the first-mode result and the second-mode result.

In some embodiments, the selecting one amongst groups of PUDIs includes: receiving an output of a first group of j PUDIs coupled in parallel; receiving an output of a second group of k PUDIs coupled in parallel, j and k being corresponding positive integers with k<j; generating a choice signal; and providing the output of the first group or the output of the second group as the output of the subject group to the comparator based on a choice signal.

In some embodiments, the subject group represents a corresponding group of PUDIs included in a continuous-time-linear equalizer (CTLE).

In some embodiments, a continuous-time-linear equalizer (CTLE) include: a buffer having an output representing an output of the CTLE; a first group of j pull-up-pull-down-inverters (PUDIs) coupled in parallel; a data input of each of the PUDIs in the first group being coupled to an input node of the CTLE; the first group being coupled between the input node of the CTLE and an input of the buffer; a first active inductor coupled to an output node of the first group; a first control input of each of the PUDIs in the first group being configured to receive a corresponding first conductivity type (FCT) selection signal that is PUDI-specific; a second control input of each of the PUDIs in the first group being configured to receive a corresponding second conductivity type (SCT) selection signal that is PUDI-specific; and a controller configured to operate as follows including adaptively set the FCT selection signals for the first group to be correspondingly in an FCT-active state or an FCT-inactive state, and adaptively set the SCT selection signals for the first group to be correspondingly in an SCT-active state or an SCT-inactive state, each of j and p being positive integers.

In some embodiments, $p<j$.

In some embodiments, each of the PUDIs includes positive-channel metal oxide semiconductor (PMOS) field-effect transistor (FETs) and negative-channel metal oxide semiconductor (NMOS) FETs (NFETs); a roster of FETs for the first group is comprised of all slave PFETs and all slave NFETs in the first group; and the controller is further configured do as follows including determine a starting-lineup of FETs from amongst the roster of the first group, adaptively set the FCT selection signals for the first group to be correspondingly in the FCT-active state or the FCT-inactive state according to the starting-lineup, and adaptively set the SCT selection signals for the first group to be correspondingly in the SCT-active state or the SCT-inactive state according to the starting-lineup.

In some embodiments, the CTLE further includes a second group of k PUDIs coupled in parallel and a second active inductor coupled to an output node of the second group; the first group and the second group are coupled in series between the input of the CTLE and the input of the buffer; a first control input of each of the PUDIs in the second group is configured to receive a corresponding FCT selection signal that is PUDI-specific; a second control input of each of the PUDIs in the second group is configured to receive a corresponding SCT selection signal that is PUDI-specific; and the controller is further configured to operate as follows including adaptively set the FCT selection signals for the second group to be correspondingly in the FCT-active state or the FCT-inactive state, and adaptively set the SCT selection signals for the second group to be correspondingly in the SCT-active state or the SCT-inactive state, k is a positive integer; $k<j$; and $p<k$.

In some embodiments, each of the PUDIs includes positive-channel metal oxide semiconductor (PMOS) field-effect transistor (FETs) and negative-channel metal oxide semiconductor (NMOS) FETs (NFETs); a roster of FETs for the second group is comprised of all slave PFETs and all slave NFETs in the second group; and the controller is further configured do as follows including determine a starting-lineup of FETs from amongst the roster of the second group, adaptively set the FCT selection signals for the second group to be correspondingly in the FCT-active state or the FCT-inactive state according to the starting-lineup, and adaptively set the SCT selection signals for the second group to be correspondingly in the SCT-active state or the SCT-inactive state according to the starting-lineup.

In some embodiments, the CTLE further includes a third group of q PUDIs coupled in parallel and a third active inductor coupled to an output node of the third group; the first group, the second group and the third group are coupled in series between the input of the CTLE and the input of the buffer; a first control input of each of the PUDIs in the third group is configured to receive a corresponding FCT selection signal that is PUDI-specific; a second control input of each of the PUDIs in the third group is configured to receive a corresponding SCT selection signal that is PUDI-specific; and the controller is further configured to operate as follows including adaptively set the FCT selection signals for the third group to be correspondingly in the FCT-active state or the FCT-inactive state, and adaptively set the SCT selection signals for the third group to be correspondingly in the SCT-active state or the SCT-inactive state; q is a positive integer; $q<j$; and $p<q$.

In some embodiments, each of the PUDIs includes positive-channel metal oxide semiconductor (PMOS) field-effect transistor (FETs) and negative-channel metal oxide semiconductor (NMOS) FETs (NFETs); a roster of FETs for the third group is comprised of all slave PFETs and all slave NFETs in the third group; and the controller is further configured do as follows including determine a starting-lineup of FETs from amongst the roster of the third group, adaptively set the FCT selection signals for the third group to be correspondingly in the FCT-active state or the FCT-inactive state according to the starting-lineup, and adaptively set the SCT selection signals for the third group to be correspondingly in the SCT-active state or the SCT-inactive state according to the starting-lineup.

In some embodiments, the first active inductor includes a second group of p PUDIs coupled in parallel to each other and a resistor coupled between an input node common to each of the p PUDIs and an output node common to each of the p PUDIs; each of the PUDIs includes positive-channel metal oxide semiconductor (PMOS) field-effect transistor (FETs) and negative-channel metal oxide semiconductor (NMOS) FETs (NFETs); a roster of FETs for the second group is comprised of all slave PFETs and all slave NFETs in the second group; and the controller is further configured do as follows including determine a starting-lineup of FETs from amongst the second group, adaptively set FCT selection signals for the second group to be correspondingly in the FCT-active state or the FCT-inactive state according to the starting-lineup, and adaptively set SCT selection signals for the second group to be correspondingly in the SCT-active state or the SCT-inactive state according to the starting-lineup.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A system for determining a starting-lineup amongst a roster, the system comprising:

a comparator configured to make a comparison between a reference voltage and an output of a subject group;

the subject group including pull-up-pull-down-inverters (PUDIs) coupled in parallel, each of the PUDIs including master and slave positive-channel metal oxide semiconductor (PMOS) field-effect transistor (FETs)

(PFETs) and slave and master negative-channel metal oxide semiconductor (NMOS) FETs (NFETs);

for each of the PUDIs, a control input of each of the slave PFET and slave NFET transistors being coupled to an input node of the PUDI, a control input of the master PFET transistor being configured to receive a PFET-selection signal that is PUDI-specific, and a control input of the master NFET transistor being configured to receive an NFET-selection signal that is PUDI-specific;

the roster being comprised of all slave PFETs and all slave NFETs in the subject group; and for the subject group, a controller configured to perform an assessment of a candidate lineup chosen from the roster, the assessment including:

set PFET-selection selection signals for the subject group to be correspondingly in an PFET-active state or a PFET-inactive state, set NFET-selection signals for the subject group to be correspondingly in an NFET-active state or an NFET-inactive state; and perform a manipulation based on the comparison including:

setting the starting-lineup to be the candidate lineup; or modifying the candidate lineup and repeating the assessment and manipulation.

2. The system of claim 1, further comprising:

a double-pole double-throw (DPDT) switching circuit configured to receive the reference voltage and the output of the subject group, and having first and second outputs coupled correspondingly to non-inverting and inverting inputs of the comparator; and wherein:

the DPDT switching circuit is further configured to operate as follows including:

in a first mode, couple the first and second outputs of the DPDT switching circuit correspondingly to (A) the reference voltage and (B) the output of the subject group to according to an active state of a first mode signal; and in a second mode, couple the first and second outputs of the DPDT switching circuit correspondingly to (B) the output of the subject group and (A) the reference voltage to according to an active state of a second mode signal; and the controller is further configured to generate the first mode signal and the second mode signal.

3. The system of claim 2, wherein:

the subject group is included in a continuous-time-linear equalizer (CTLE).

4. The system of claim 2, wherein:

the DPDT switching circuit includes:

a first FET coupled between a first node and the non-inverting input of the comparator, the first node being configured to receive the reference voltage;

a second FET coupled between the first node and the inverting input of the comparator;

a third FET coupled between a second node and the non-inverting input of the comparator, the second node being configured to receive the output of the subject group; and a fourth FET coupled between the second node and the inverting input of the comparator;

a control input of each of the first and fourth FETs is configured to receive the first mode signal; and a control input of each of the second and third FETs is configured to receive the second mode signal.

5. The system of claim 2, wherein:

in the first mode, the comparator is further configured to make a first comparison yielding a first-mode result;

in the second mode, the comparator is further configured to make a second comparison yielding a second-mode result; and the controller is further configured to operate as follows including:

make a first iteration of the assessment of the candidate lineup in the first mode;

make a second iteration of the assessment of the candidate lineup in the second mode; and perform the manipulation based on the first-mode result and the second-mode result.

6. The system of claim 1, wherein:

the system further comprises:

a first group of j PUDIs coupled in parallel;

a second group of k PUDIs coupled in parallel, k being a positive integer;

j and k being corresponding positive integers with $k<j$; and a multiplexer configured to operate as follows including:

receive the output of the first group and an output of the second group; and adaptively provide the output of the first group or the output of the second group as the output of the subject group to the comparator based on a choice signal;

the controller is further configured to generate the choice signal.

7. A method of determining a starting-lineup amongst a roster, the method comprising:

selecting one amongst groups of pull-up-pull-down-inverters (PUDIs) to be a subject group, each of the PUDIs including master and slave positive-channel metal oxide semiconductor (PMOS) field-effect transistor (FETs) (PFETs) and slave and master negative-channel metal oxide semiconductor (NMOS) FETs (NFETs);

coupling the PUDIs of the subject group in parallel;

for each of the PUDIs in the subject group:

coupling a control input of each of the slave PFET and slave NFET transistors to an input node of the PUDI;

configuring a control input of the master PFET transistor to receive a PFET-selection signal that is PUDI-specific; and configuring a control input of the master NFET transistor to receive an NFET-selection signal that is PUDI-specific;

assessing a candidate lineup for the subject group chosen from the roster, the roster being comprised of all slave PFETs and all slave NFETs in the subject group, the assessing including:

setting the PFET-selection signals to be correspondingly in a PFET-active state or a PFET-inactive state according to the candidate lineup;

setting the NFET-selection signals to be correspondingly in an NFET-active state or an NFET-inactive state according to the candidate lineup; and using a comparator to make a comparison of a reference voltage and an output of the subject group; and performing a manipulation based on the comparison including:

setting the starting-lineup to be the candidate lineup; or modifying the candidate lineup and repeating the assessment and manipulation.

8. The method of claim 7, further comprising:

generating a first mode signal corresponding to a first mode;

in the first mode, coupling (A) the output of the subject group and (B) the reference voltage correspondingly to non-inverting and inverting inputs of the comparator according to an active state of the first mode signal;

generating a second mode signal corresponding to a second mode; and in the second mode, coupling (B) the reference voltage and (A) the output of the subject group correspondingly to the non-inverting and inverting inputs of the comparator according to an active state of the second mode signal.

9. The method of claim 8, further comprising:

coupling a first FET between a first node and the non-inverting input of the comparator;

configuring the first node to receive the reference voltage;

coupling a second FET between the first node and the inverting input of the comparator;

coupling a third FET between a second node and the non-inverting input of the comparator;

configuring the second node to receive the output of the subject group;

coupling a fourth FET between the second node and the inverting input of the comparator;

configuring a control input of each of the first and fourth FETs to receive the first mode signal; and configuring a control input of each of the second and third FETs to receive the second mode signal.

10. The method of claim 8, further comprising:

in the first mode, controlling the comparator to make a first comparison yielding a first-mode result;

in the second mode, controlling the comparator to make a second comparison yielding a second-mode result;

in the first mode, making a first iteration of the assessing a candidate lineup;

in the second mode, making a second iteration of the assessing a candidate lineup; and the performing the manipulation includes:

basing the manipulation on the first-mode result and the second-mode result.

11. The method of claim 7, wherein the selecting one amongst groups of PUDIs includes:

receiving an output of a first group of j PUDIs coupled in parallel;

receiving an output of a second group of k PUDIs coupled in parallel;

j and k being corresponding positive integers with k<j;

generating a choice signal; and providing the output of the first group or the output of the second group as the output of the subject group to the comparator based on a choice signal.

12. The method of claim 7, wherein:

the subject group represents a corresponding group of PUDIs included in a continuous-time-linear equalizer (CTLE).

13. A continuous-time-linear equalizer (CTLE) comprising:

a buffer having an output representing an output of the CTLE;

a first group of j pull-up-pull-down-inverters (PUDIs) coupled in parallel;

a data input of each of the PUDIs in the first group being coupled to an input node of the CTLE;

the first group being coupled between the input node of the CTLE and an input of the buffer;

a first active inductor coupled to an output node of the first group;

a first control input of each of the PUDIs in the first group being configured to receive a corresponding first conductivity type (FCT) selection signal that is PUDI-specific;

a second control input of each of the PUDIs in the first group being configured to receive a corresponding second conductivity type (SCT) selection signal that is PUDI-specific; and a controller configured to operate as follows including:

adaptively set the FCT selection signals for the first group to be correspondingly in an FCT-active state or an FCT-inactive state; and adaptively set the SCT selection signals for the first group to be correspondingly in an SCT-active state or an SCT-inactive state; and each of j and p being positive integers.

14. The CTLE of claim 13, wherein:

p<j.

15. The CTLE of claim 13, wherein:

each of the PUDIs includes positive-channel metal oxide semiconductor (PMOS) field-effect transistor (FETs) and negative-channel metal oxide semiconductor (NMOS) FETs (NFETs);

a roster of FETs for the first group is comprised of all slave PFETs and all slave NFETs in the first group; and the controller is further configured do as follows including:

determine a starting-lineup of FETs from amongst the roster of the first group;

adaptively set the FCT selection signals for the first group to be correspondingly in the FCT-active state or the FCT-inactive state according to the starting-lineup; and adaptively set the SCT selection signals for the first group to be correspondingly in the SCT-active state or the SCT-inactive state according to the starting-lineup.

16. The CTLE of claim 13, wherein:

the CTLE further includes:

a second group of k PUDIs coupled in parallel; and a second active inductor coupled to an output node of the second group;

the first group and the second group are coupled in series between the input of the CTLE and the input of the buffer;

a first control input of each of the PUDIs in the second group is configured to receive a corresponding FCT selection signal that is PUDI-specific;

a second control input of each of the PUDIs in the second group is configured to receive a corresponding SCT selection signal that is PUDI-specific; and the controller is further configured to operate as follows including:

adaptively set the FCT selection signals for the second group to be correspondingly in the FCT-active state or the FCT-inactive state; and adaptively set the SCT selection signals for the second group to be correspondingly in the SCT-active state or the SCT-inactive state;

k is a positive integer;

k<j; and p<k.

17. The CTLE of claim 16, wherein:

each of the PUDIs includes positive-channel metal oxide semiconductor (PMOS) field-effect transistor (FETs) and negative-channel metal oxide semiconductor (NMOS) FETs (NFETs);

a roster of FETs for the second group is comprised of all slave PFETs and all slave NFETs in the second group; and the controller is further configured do as follows including:

determine a starting-lineup of FETs from amongst the roster of the second group;

adaptively set the FCT selection signals for the second group to be correspondingly in the FCT-active state or the FCT-inactive state according to the starting-lineup; and adaptively set the SCT selection signals for the second group to be correspondingly in the SCT-active state or the SCT-inactive state according to the starting-lineup.

18. The CTLE of claim 16, wherein:

the CTLE further includes:

a third group of q PUDIs coupled in parallel; and a third active inductor coupled to an output node of the third group;

the first group, the second group and the third group are coupled in series between the input of the CTLE and the input of the buffer;

a first control input of each of the PUDIs in the third group is configured to receive a corresponding FCT selection signal that is PUDI-specific;

a second control input of each of the PUDIs in the third group is configured to receive a corresponding SCT selection signal that is PUDI-specific; and the controller is further configured to operate as follows including:

adaptively set the FCT selection signals for the third group to be correspondingly in the FCT-active state or the FCT-inactive state; and adaptively set the SCT selection signals for the third group to be correspondingly in the SCT-active state or the SCT-inactive state;

q is a positive integer;

$q<j$; and $p<q$.

19. The CTLE of claim 18, wherein:

each of the PUDIs includes positive-channel metal oxide semiconductor (PMOS) field-effect transistor (FETs) and negative-channel metal oxide semiconductor (NMOS) FETs (NFETs);

a roster of FETs for the third group is comprised of all slave PFETs and all slave NFETs in the third group; and the controller is further configured do as follows including:

determine a starting-lineup of FETs from amongst the roster of the third group;

adaptively set the FCT selection signals for the third group to be correspondingly in the FCT-active state or the FCT-inactive state according to the starting-lineup; and adaptively set the SCT selection signals for the third group to be correspondingly in the SCT-active state or the SCT-inactive state according to the starting-lineup.

20. The CTLE of claim 13, wherein:

the first active inductor includes:

a second group of p PUDIs coupled in parallel to each other; and a resistor coupled between an input node common to each of the p PUDIs and an output node common to each of the p PUDIs;

each of the PUDIs includes positive-channel metal oxide semiconductor (PMOS) field-effect transistor (FETs) and negative-channel metal oxide semiconductor (NMOS) FETs (NFETs);

a roster of FETs for the second group is comprised of all slave PFETs and all slave NFETs in the second group; and the controller is further configured do as follows including:

determine a starting-lineup of FETs from amongst the second group;

adaptively set FCT selection signals for the second group to be correspondingly in the FCT-active state or the FCT-inactive state according to the starting-lineup; and adaptively set SCT selection signals for the second group to be correspondingly in the SCT-active state or the SCT-inactive state according to the starting-lineup.

* * * * *